United States Patent [19]
Matsumoto et al.

[11] Patent Number: 5,881,017
[45] Date of Patent: Mar. 9, 1999

[54] SYNCHRONOUS SEMICONDUCTOR MEMORY DEVICE ALLOWING FAST OPERATION IN EITHER OF PREFETCH OPERATION AND FULL PAGE MODE OPERATION

[75] Inventors: Junko Matsumoto; Hisashi Iwamoto, both of Hyogo, Japan

[73] Assignee: Mitsubishi Denki Kabushiki Kaisha, Tokyo, Japan

[21] Appl. No.: 992,901

[22] Filed: Dec. 18, 1997

[30] Foreign Application Priority Data

Jan. 10, 1997 [JP] Japan .................................. 9-003169
May 23, 1997 [JP] Japan .................................. 9-133753
Oct. 15, 1997 [JP] Japan .................................. 9-282362

[51] Int. Cl.$^6$ .................................................. G11C 13/00
[52] U.S. Cl. .............................. 365/230.04; 365/230.04; 365/235
[58] Field of Search ..................... 365/230.03, 230.01, 365/189.01, 230.04, 235

[56] References Cited

U.S. PATENT DOCUMENTS 4,092,734  5/1978  Collins ................................ 365/238
5,537,354  7/1996  Mochizuki et al. .

FOREIGN PATENT DOCUMENTS 7-169263  7/1995  Japan .

OTHER PUBLICATIONS

"16Mbit Synchronous DRAM with 125Mbyte/sec Data Rate," Choi et al., 1993 Symposium on VLSI Circuits, pp. 65–66.

Primary Examiner—Terrell W. Fears
Attorney, Agent, or Firm—McDermott, Will & Emery

[57] ABSTRACT

SDRAM 1000 outputs data, in a 2-bit prefetch operation, by simultaneously selecting two columns in memory cell array banks A0 and A1 in accordance with column select signals YE0–YEk and YO0–YOk issued from Y-address operation circuit 68. In a full page mode, data are output from all columns crossing rows alternately selected in memory cell array banks A0 and A1 in accordance with an internal address signal issued from a Y-address counter circuit 82.

9 Claims, 22 Drawing Sheets

FIG. 11

BURST LENGTH = 4 (MBL4 = 1)

| (A0,A1) WITH ACTIVE $\phi$ya | | t0　t1　t2　t3 |
|---|---|---|
| ( 0, 0 ) | YO1 | 0 → 1 ──────→ 0 |
|  | YE1 | 0 → 1 ──────→ 0 |
| ( 1, 0 ) | YO1 | 0 → 1 ──────→ 0 |
|  | YE1 | 1 → 0 ──────→ 1 |
| ( 0, 1 ) | YO1 | 1 → 0 ──────→ 1 |
|  | YE1 | 1 → 0 ──────→ 1 |
| ( 1, 1 ) | YO1 | 1 → 0 ──────→ 1 |
|  | YE1 | 0 → 1 ──────→ 0 |

FIG. 12

BURST LENGTH = 8 (MBL8 = 1)

| (A0,A1,A2) WITH ACTIVE $\phi$ya | | t0　t1　t2　t3　t4　t5　t6　t7 |
|---|---|---|
| ( 0, 0, 0 ) | YO1 | 0 → 1 ──→ 0 ──→ 1 ──→ 0 |
|  | YO2 | 0 → 0 ──→ 1 ──→ 1 ──→ 0 |
|  | YE1 | 0 → 1 ──→ 0 ──→ 1 ──→ 0 |
|  | YE2 | 0 → 0 ──→ 1 ──→ 1 ──→ 0 |
| ( 1, 0, 0 ) | YO1 | 0 → 1 ──→ 0 ──→ 1 ──→ 0 |
|  | YO2 | 0 → 0 ──→ 1 ──→ 1 ──→ 0 |
|  | YE1 | 1 → 0 ──→ 1 ──→ 0 ──→ 1 |
|  | YE2 | 0 → 1 ──→ 1 ──→ 0 ──→ 0 |
| ( 0, 1, 0 ) | YO1 | 1 → 0 ──→ 1 ──→ 0 ──→ 1 |
|  | YO2 | 0 → 1 ──→ 1 ──→ 0 ──→ 0 |
|  | YE1 | 1 → 0 ──→ 1 ──→ 0 ──→ 1 |
|  | YE2 | 0 → 1 ──→ 1 ──→ 0 ──→ 0 |
| ( 1, 1, 0 ) | YO1 | 1 → 0 ──→ 1 ──→ 0 ──→ 1 |
|  | YO2 | 0 → 1 ──→ 1 ──→ 0 ──→ 0 |
|  | YE1 | 0 → 1 ──→ 0 ──→ 1 ──→ 0 |
|  | YE2 | 1 → 1 ──→ 0 ──→ 0 ──→ 1 |
| ( 0, 0, 1 ) | YO1 | 0 → 1 ──→ 0 ──→ 1 ──→ 0 |
|  | YO2 | 1 → 1 ──→ 0 ──→ 0 ──→ 1 |
|  | YE1 | 0 → 1 ──→ 0 ──→ 1 ──→ 0 |
|  | YE2 | 1 → 1 ──→ 0 ──→ 0 ──→ 1 |
| ( 1, 0, 1 ) | YO1 | 0 → 1 ──→ 0 ──→ 1 ──→ 0 |
|  | YO2 | 1 → 1 ──→ 0 ──→ 0 ──→ 1 |
|  | YE1 | 1 → 0 ──→ 1 ──→ 0 ──→ 1 |
|  | YE2 | 1 → 0 ──→ 0 ──→ 1 ──→ 1 |
| ( 0, 1, 1 ) | YO1 | 1 → 0 ──→ 1 ──→ 0 ──→ 1 |
|  | YO2 | 1 → 0 ──→ 0 ──→ 1 ──→ 1 |
|  | YE1 | 1 → 0 ──→ 1 ──→ 0 ──→ 1 |
|  | YE2 | 1 → 0 ──→ 0 ──→ 1 ──→ 1 |
| ( 1, 1, 1 ) | YO1 | 1 → 0 ──→ 1 ──→ 0 ──→ 1 |
|  | YO2 | 1 → 0 ──→ 0 ──→ 1 ──→ 1 |
|  | YE1 | 0 → 1 ──→ 0 ──→ 1 ──→ 0 |
|  | YE2 | 0 → 0 ──→ 1 ──→ 1 ──→ 0 |

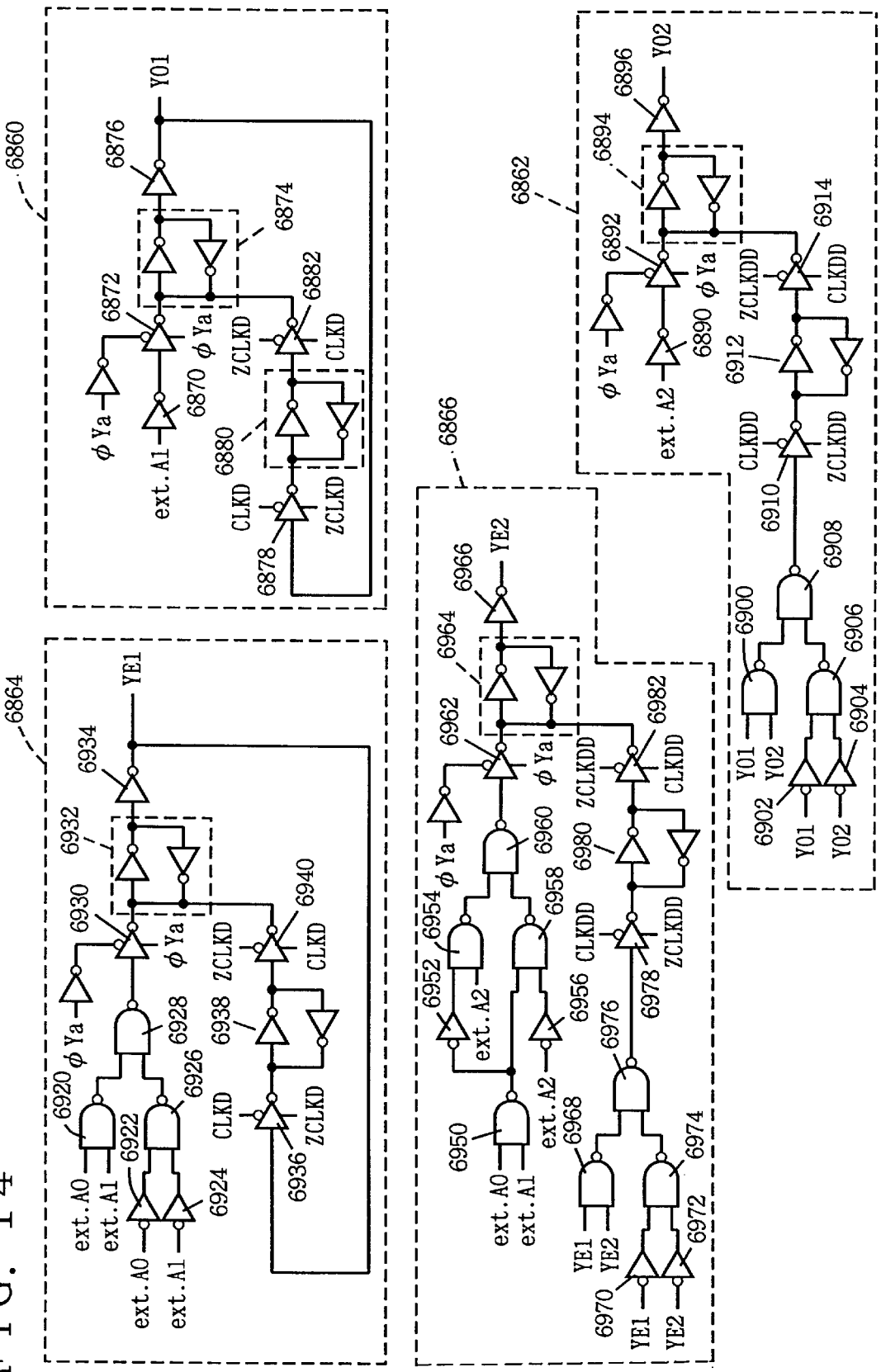
F I G. 1 4

FIG. 15

| A2 | A1 | A0 | OUTPUT OF NAND CIRCUIT 6960 | YE2 |
|----|----|----|----|----|
| 0 | 0 | 0 | 1 | 0 |
| 0 | 0 | 1 | 1 | 0 |
| 0 | 1 | 0 | 1 | 0 |
| 0 | 1 | 1 | 0 | 1 |
| 1 | 0 | 0 | 0 | 1 |
| 1 | 0 | 1 | 0 | 1 |
| 1 | 1 | 0 | 0 | 1 |
| 1 | 1 | 1 | 1 | 0 |

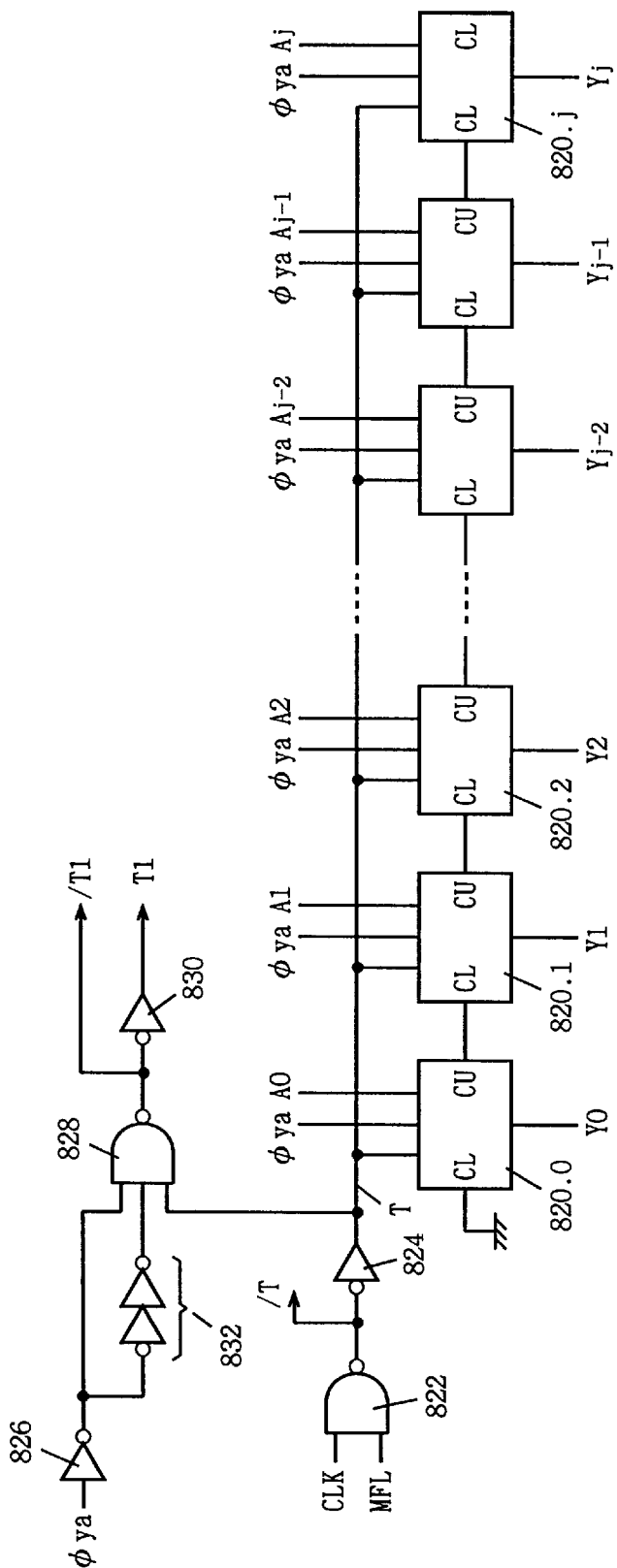
F I G. 18

CONTINUOUS WRITE OPERATION (BURST LENGTH = 8)

SYNCHRONOUS SEMICONDUCTOR MEMORY DEVICE ALLOWING FAST OPERATION IN EITHER OF PREFETCH OPERATION AND FULL PAGE MODE OPERATION

BACKGROUND OF THE INVENTION

1. Field of the Invention

The present invention relates to a semiconductor memory device, and in particular to a synchronous semiconductor memory device for taking in an external signal in synchronization with an externally and periodically applied clock signal. More particularly, the invention relates to a synchronous dynamic random access memory (which will be referred to as a "SDRAM" hereinafter) allowing random access.

2. Description of the Background Art

Dynamic random access memories (which will be referred to as "DRAMs") which are used as main storage units have been improved for faster operation, but the operation speeds thereof are still lower than operation speeds of microprocessors (which will be referred to as "MPUs" hereinafter). Therefore, it is often said that the access time and cycle time of the DRAM form a bottleneck in performance of a whole system. In recent years, SDRAMs which operate in synchronization with clock signals have been available as main storage units for fast MPUs.

For fast access, the SDRAM may employ such a specification that continuous bits (e.g., eight bits) per one data I/O terminal are accessed fast in synchronization with a system clock signal. FIG. 25 shows a standard timing chart satisfying this specification for continuous access. More specifically, FIG. 25 shows an operation of reading data of continuous eight bits in a SDRAM which can input and output data of 8 bits (1 byte) through data I/O terminals DQ0–DQ7. Thus, data of 64 bits (=8 bits×8) can be continuously read out.

The number of bits of data which are continuously read or written is called a burst length. In the SDRAM, the burst length can be changed by a mode register set.

As shown in FIG. 25, the SDRAM takes in externally supplied control signals such as a row address strobe signal /RAS, a column address strobe signal /CAS and an address signal Add, for example, at a rising edge of an externally supplied clock signal CLK which is a system clock.

Address signal Add contains a row address signal Xa and a column address signal Yb which are multiplexed together in a time sharing manner.

At the rising edge of clock signal CLK in a cycle 1, external row address strobe signal ext./RAS is active and therefore at "L" level, and external column address strobe signal ext./CAS and external write enable signal ext./WE are at "H" level. In this case, address signal Add at this point of time is taken in as a bank designating signal BA or BB and a row address signal Xa, and one row in one bank of the SDRAM memory cell array is selected in accordance with row address signal Xa.

At the falling edge of clock signal CLK in a cycle 4, external column address strobe signal ext./CAS is active and therefore at "L" level, and external row address strobe signal ext./RAS and external write enable signal ext./WE are at "H" level. When this state is attained, the operation enters a read mode, and address signal Add supplied at this point of time is taken in as bank designating signal BA or BB and a column address signal Yb. One column in the memory cell array is selected in accordance with this column address signal Yb. When a predetermined clock period (3 clock cycles in FIG. 25) elapses from the cycle in which this read mode is set, first data b0 among data of 8 bits to be output from data I/O terminal DQ is output. Thereafter, data b1–b7 are successively output in response to rising of clock signal CLK.

FIG. 26 is a timing chart showing change in external signal over time during an operation of continuously writing data of 8 bits per one data I/O terminal DQ in the SDRAM.

In the write operation, bank designating signal BA or BB and row address signal Xa are taken in similarly to the data read operation. More specifically, when such a state is achieved at the rising edge of clock signal CLK in cycle 1 that signal ext./RAS is active and therefore at "L" level, and signals ext./CAS and ext./WE are at "H" level, address signal Add at this time is taken in as bank designating signal BA or BB and row address signal Xa, and one row in one bank of the SDRAM memory cell array is selected in accordance with row address signal Xa.

When such a state is attained at the rising edge of clock signal CLK in cycle 4 that external row address strobe signal ext./RAS is at "H" level, and both signals ext./CAS and ext./WE are active and therefore at "L" level, the operation enters the write mode, and address signal Add at this time is taken in as bank designating signal BA or BB and column address signal Yb. In accordance with column address signal Yb thus taken, one column in the memory cell array is selected. At the same time, data b0 applied to data I/O terminal DQ is taken in as first write data among data of 8 bits to be continuously written, and is written into the selected memory cell.

After the cycle in which this write mode is set, input data b1–b7 are successively taken into the same row of the same bank in synchronization with clock signal CLK, and the input data is written into the memory cells designated by the column addresses which are internally and successively issued.

As described above, the SDRAM does not operate in a manner similar to that of a conventional DRAM in which the operation is performed by taking in an address signal, input data and others in synchronization with external control signals, i.e., row address strobe signal ext./RAS and column address strobe signal ext./CAS, but operates in such a manner that the external signals such as address strobe signals ext./RAS and ext./CAS, address signal and input data are taken in at the rising edge of clock signal CLK which is an externally supplied system clock.

As described above, the SDRAM performs the operation of taking in the control signals and data signals in synchronization with the externally supplied clock signal. Therefore, it is not necessary to keep a margin for a data input/output time which may be required due to a skew (shift in timing) of the address signal. This achieves an advantage that the cycle time can be reduced. Since writing and reading of continuous data can be executed in synchronization with the clock signal as described above, it is possible to reduce an access time in the operation of continuously accessing the continuous addresses.

As an architecture achieving the SDRAM, Choi et. al. has announced a SDRAM of 2-bit prefetch for writing data two bits a time (1993 Symposium on VLSI Circuit). The 2-bit prefetch operation will now be described below with reference to the drawings.

FIG. 27 shows a functional structure of a major portion of a SDRAM 300 performing the 2-bit prefetch operation in the prior art.

More specifically, FIG. 27 shows a structure of a functional portion related to input/output data of 1 bit in the SDRAM of a x16-bit structure.

The memory cell array portion related to data I/O terminal DQi includes memory cell arrays 71a and 71a' forming a bank A, and memory cell arrays 71b and 71b' forming a bank B.

Bank A is divided into memory cell array banks A0 and A1 to be selected in accordance with the address signal, and memory cell array bank B is likewise divided into memory cell array banks B0 and B1.

For memory cell array banks A0 and A1, there are provided X-decoder groups 52a and 52a' each including a plurality of row decoders for decoding address signals ext.A0–ext.Ai and selecting corresponding rows in memory cell array 71a, 71a', Y-decoder groups 53a and 53a' each including a plurality of column decoders which decode column address signals Y1–Yk and issue column select signals for selecting the corresponding columns in memory cell array 71a or 71a', and sense amplifier groups 54a and 54a' for sensing and amplifying data of the memory cells connected to the selected rows in memory cell arrays 71a and 71a', respectively.

X-decoder groups 52a and 52a' include row decoders provided correspondingly to the word lines in the memory cell arrays 71a and 71a', respectively. In accordance with internal address signals X0–Xi which are issued in response to external address signals ext.A0–ext.Ai, respectively, the corresponding row decoders selects the word lines provided correspondingly to the row decoders, respectively, and sense amplifier groups 54a and 54a' each sense the data of the selected one row.

Y-decoder groups 53a and 53a' each include column decoders provided correspondingly to column select lines in memory cell arrays 71a or 71a', respectively. The column select line selects intended data from data of one row sensed by the sense amplifier group 54a or 54a'.

X-decoder group 52a and Y-decoder group 53a select the memory cell of 1 bit in memory cell array bank A0, and X-decoder group 52a' and Y-decoder group 53a' select the memory cell of 1 bit in memory cell array bank A1. X-decoder groups 52a and 52a' as well as Y-decoder groups 53a and 53a' are activated by bank designating signal BA. For memory cell array banks B0 and B1, there are provided X-decoder groups 52b and 52b' and Y-decoder groups 53b and 53b', respectively, which are activated by bank designating signal BB.

For the bank A, there are further provided internal data transmission lines (global I/O lines) for transmitting data sensed and amplified by sense amplifier groups 54a and 54a' and for transmitting write data to the memory cells selected in memory cell arrays 71a and 71a'. More specifically, global I/O line bus GIO0 is provided for memory cell array bank A0, and global I/O line bus GIO1 is provided for memory cell array bank A1.

A write register 59a and a write buffer group 60a are provided correspondingly to global I/O line pair GIO0 for memory cell array bank A0. A write register 59a' and a write buffer group 60a' are provided correspondingly to global I/O line pair GIO1 for memory cell array bank A1.

An input buffer 58a having a width of 1 bit produces internal write data from input data sent to data I/O terminal DQi. A selector 69a is controlled by a selector control signal φSEA issued from a second control signal generating circuit 63, and selectively applies an output of input buffer 58a to write registers 59a or 59a'.

Thus, input buffer 58a is activated in accordance with an input buffer activating signal φWDBA, and thereby produces the internal write data from the input data applied to data I/O terminal DQi. Selector 69a is controlled in accordance with a selector control signal φSEA which is issued from a second control signal generating circuit 63 in accordance with the address signal, as will be described later, and thereby sends the internal write data to one of write registers 59a and 59a'.

Write registers 59a and 59a' are activated in response to register activating signals φRWA0 and φRwA1, respectively, and successively store the write data sent from selector 69a. Write buffer groups 60a and 60a' are activated in response to write buffer activating signals φWBA0 and φWBA1, and thereby operate to amplify and transmit the data stored in corresponding write registers 59a and 59a' onto corresponding global I/O line pair buses GIO0 and GIO1, respectively.

An equalize circuit (not shown) is provided commonly for two global I/O line pairs GIO0 and GIO1. This equalize circuit is activated in response to an equalize circuit activating signal φWEQA (not shown), and equalizes global I/O line pair buses GIO0 and GIO1.

Likewise, memory cell array bank B includes memory cell array banks B0 and B1. Memory cell array banks B0 and B1 include X-decoder groups 52b and 52b', Y-decoder groups 53b and 53b', sense amplifier groups 54b and 54b' which are activated in response to sense amplifier activating signal φSAB, equalize circuit groups (not shown) which are activated in response to equalize circuit activating signals φWEQB, write buffer groups 60b and 60b' which are activated in response to buffer activating signals φWBB0 and φWBB1, respectively, write registers 59b and 59b' which are activated in response to register activating signals φRwB0 and φRwB1, respectively, and selectors 69b and 70b which are controlled by selector control signal φSEB, respectively, and also include an input buffer 58b which is activated in response to buffer activating signal φWDBB.

The banks A and B have the same structures. Provision of write registers 59a and 59a' as well as 59b and 59b' allows input/output of data to and from one data I/O terminal DQ1 in synchronization with a fast clock signal.

The control signals for banks A and B are issued in accordance with bank designating signals BA and BB in such a manner that the control signals for only one of banks A and B are issued.

In the functional block for data reading, data sensed and amplified by sense amplifiers 54a and 54a' are transmitted onto buses GIO of the internal data transmitting lines (global I/O lines) provided for bank A.

For data reading, there are provided a read preamplifier 55a, which is activated in response to a preamplifier activating signal φRBA0 and thereby amplifies data on global I/O line bus GIO0 in bank A0, and a read register 56a, which is activated in response to a register activating signal φRrA0 and thereby stores the data amplified by read preamplifier 55a.

There are also provided a read preamplifier 55a', which is activated in response to a preamplifier activating signal φRBA1 and thereby amplifies data on global I/O line bus GIO1 provided correspondingly to bank A1, and a read register 56a', which is activated in response to a register activating signal φRrA1 and thereby stores the data amplified by read preamplifier 55a'.

A functional block 100 shown in FIG. 27 further includes a selector 70a which receives data from read registers 56a and 56a', and successively issues data sent from read register 56a or data sent from read register 56a' in accordance with selector signal φSEA, and an output buffer 67a which receives the output of selector 70a for successively outputting the data.

Read preamplifier 55a and read register 56a each has a structure of a width of 4 bits corresponding to the four global I/O line pairs. Read register 56a is responsive to register activating signal φRrA1 to latch and successively output the data sent from read preamplifier 55a.

Read preamplifier 55a' and read register 56a' operate in manners similar to those described above.

The output buffer 57a is responsive to an output enable signal φOUTA to transmit the data, which is successively sent from read selector 70a, to data I/O terminal DQi. In the structure shown in FIG. 27, input and output of data are performed through data I/O terminal DQi. However, input and output of data may be performed through different terminals, respectively.

The completely same structure is employed for memory cell array bank B. Thus, the structure for memory cell array bank B includes read amplifiers B0 and B1 which are activated by read amplifier activating signals φRBB0 and RBB1, respectively, read registers B0 and B1 which are activated by register activating signals φRrB0 and φRrB1, respectively, a selector 70b which is responsive to a signal φSEB to selectively output the output of read register B0 or B1, and an output buffer 57b which is responsive to a signal φOUTB to output the output data coming from selector 70b to data I/O terminal DQi.

The functional block 100 shown in FIG. 27 is arranged correspondingly to each data I/O terminal. If the SDRAM has a x16-bit structure, the SDRAM includes sixteen functional blocks 100 which correspond to the data I/O terminals, respectively.

Banks A and B have the substantially same structures and only one of them is selected in accordance with bank designating signals BA and BB, whereby the banks A and B can operate substantially independently of each other.

As a control system for independently controlling the banks A and B, there are arranged a first control signal generating circuit 62, a second control signal generating circuit 63 and a clock counter 64.

First control signal generating circuit 62 takes in the externally supplied control signals, i.e., external row address strobe signal ext./RAS, external column address strobe signal ext./CAS, chip select signal ext./CS and external write enable signal ext./WE in synchronization with external clock signal CLK, and issues internal control signals φxa, φya, φW, φO, φR and φC.

Second control signal generating circuit 63 is responsive to bank designating signals BA and BB, a lowest bit Y0 of the externally applied address signal, internal control signals φW, φO, φR and φC, and the output of clock counter 64, and thereby issues control signals for independently driving banks A and B, i.e., equalize circuit activating signals φWEQA and φWEQB, sense amplifier activating signals φSAA and φSAB, write buffer activating signals φWBA0, φWBA1, φWBB0 and φWBB1, write register activating signals φRwA0, φRwA1, φRwB0 and φRwB1, selector control signals φSEA and φSEB, input buffer activating signals φDBA and φDBB, read preamplifier activating signals φRBB0, φRBB1, φRBA0 and φRBA1, read register activating signals φRrB0, φRrB1, φRrA0 and φRrA1, and output buffer activating signals φOUTA and φOUTB.

SDRAM 3000 further includes, as peripheral circuits, an X-address buffer 65 which is responsive to internal control signal φxa and thereby operates to take in external address signals ext./A0–ext./Ai and issue internal address signals X0–Xj as well as bank select signals BA and BB, and a Y-address buffer 66 which is activated in response to internal control signal φya, and thereby issues column select signals Y0–Yk for designating the column select lines.

SDRAM 3000 further includes, as peripheral circuits, a Y-address operation circuit 68 which is controlled by clock signal CLK, and issues signals YE0–YEk and YO0–YOk which correspond to the column addresses to be selected.

Signals YE0–YEk described above represent internal column address signals corresponding to the column addresses in memory cell array bank A0 or B0, and signals YO0–YOk are internal column address signals representing the column addresses in memory cell array bank A1 or B1.

The above description has been given on the structure including only two banks. However, the banks may be generally increased in number, and the registers, buffers and I/O lines of the numbers corresponding to the number of banks may be employed. Even in this case, the banks can be accessed independently from each other.

The data is selectively written into memory cell array bank A0 or A1 in accordance with the lowest one bit of the address which is applied at the time of input of a write command.

This operation will be briefly described below. When the write command is input, the Y-decoder is activated in accordance with the applied address. The first data is stored in register A0, and then the data stored in register A0 is written into memory cell array bank A0 through I/O line GIO0 in response to activation of signal φWBA0.

The data applied at the next rising edge of the clock signal is stored in register A1, and thereafter is written into memory cell array bank A1 through I/O line GIO1 in response to activation of signal φWBA1. When writing of the data of 2 bits is completed, signals φWBA0 and φWBA1 are deactivated, and the potential levels on I/O lines GIO0 and GIO1 connecting the memory cell arrays to the buffers are equalized for next writing of data.

The 2-bit prefetch operation described above has such a disadvantage that an area penalty is large because the registers, buffers and I/O lines are required for each bank independently of the other banks. This disadvantage becomes more remarkable with increase in number of the banks and increase in number of bits of input and output.

Thus, due to a large area penalty, the 2-bit prefetch manner cannot be actually used for data reading, for example, in a so-called page mode, i.e., an operation mode that data is read from all the memory cells arranged at crossings between the selected row and all the columns crossing the selected row.

The above problem generally arises not only in the case where the stored data is read from all the memory cells present at the crossing between the selected row and all the columns crossing the selected row, but also in the case where the stored data is simultaneously read from a large number of memory cells among those present at the crossing between the selected row and the columns crossing the selected row.

For the above problem, Takai et. al. has announced a SDRAM of a pipeline type (1993 Symposium on VLSI Circuit). FIG. 28 shows a structure of this SDRAM 4000. FIG. 28 schematically shows a structure of a functional portion 300 of SDRAM 4000.

A difference with respect to SDRAM 3000 in FIG. 27 is as follows. In SDRAM 3000, each of memory cell array banks A and B is further divided into banks A0 and A1 or banks B0 and B1. However, SDRAM 4000 does not employ this structure. Therefore, the numbers of required registers, buffers and I/O lines are equal to those of a standard DRAM, and a difference with respect to the standard DRAM is that a latch circuit is arranged on a critical path of data transmission.

In contrast to SDRAM 3000, the registers, buffers and I/O lines are not distinguished for banks A0 and A1, and are commonly used for both the banks.

The data to be continuously written can be processed in such a manner that input data is written into the register while preceding data latched by the register is being written into the corresponding memory cell array bank. However, this data writing is performed bit by bit in contrast to the 2-bit prefetch type. Therefore, an operation frequency cannot be increased compared with the 2-bit prefetch type allowing simultaneous writing of data of two bits.

SUMMARY OF THE INVENTION

An object of the invention is to provide a SDRAM which allows a fast operation and is provided with an operation mode such as a full page mode for simultaneously reading many data from a selected row.

Another object of the invention is to provide a SDRAM in which a full page operation mode and a 2-bit prefetch operation mode can be selected.

In summary, the invention provides a synchronous semiconductor memory device for taking in external signals including a control signal, an address signal and a data signal or outputting a data signal in synchronization with an external clock signal, including a memory cell array, a row select circuit, an internal address generating circuit, a column select circuit and a data read circuit.

The memory cell array includes a plurality of memory cells arranged in rows and columns. The memory cell array includes first and second memory cell array banks. The row select circuit is responsive to an externally supplied address signal to select corresponding rows in the first and second memory cell array banks. The internal address generating circuit is responsive to the externally supplied address signal to issue an internal address signal corresponding to a designated operation mode.

The column select circuit operates in a first operation mode simultaneously for the first and second memory cell array banks to select successively a first predetermined number of columns to be selected in each of the first and second memory cell array banks in response to the internal address, and operates in a second operation mode to select successively a second predetermined number of columns larger in number than said first predetermined number and crossing the selected row.

The data read circuit operates in the first operation mode to amplify simultaneously the data sent from the first and second memory cell array banks selected by the column select circuit and respond to the external clock signal by applying alternately the read date to a data output terminal, and operates in the second operation mode to amplify alternately the data sent from the first and second memory cell array banks selected by the column select circuit and respond to the external clock signal by alternately applying the read data to the data output terminal.

Preferably, the second predetermined number is equal to the number of all the columns crossing the selected row.

As a major advantage of the invention, therefore, the device can operate selectively in a 2-bit prefetch operation mode and an operation mode for simultaneously reading multibit data in accordance with external designation of the operation mode.

As another advantage, the invention allows selection of the 2-bit prefetch operation and the full page mode operation in accordance with external designation of the operation mode.

Further, in the full page mode operation, read amplifier circuits operate alternately in every cycle of the external clock signal so that precharging and others of one of read circuit systems can be performed during operation of the other, and therefore the reading speed in the full page mode can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 shows changes in YO1 and YE1 in the case of a burst length of 4;

FIG. 12 shows changes in YO1, YO2, YE1 and YE2 in the case of a burst length of 8;

FIG. 14 is a circuit diagram showing another portion of the structure of the column address generating circuit 684;

FIG. 15 shows an operation of a second even-numbered column select signal generating circuit 6866 in the column address generating circuit 684;

FIG. 18 is a schematic block diagram showing a structure of a Y-address counter circuit 82;

DESCRIPTION OF THE PREFERRED EMBODIMENTS

Figure 1:
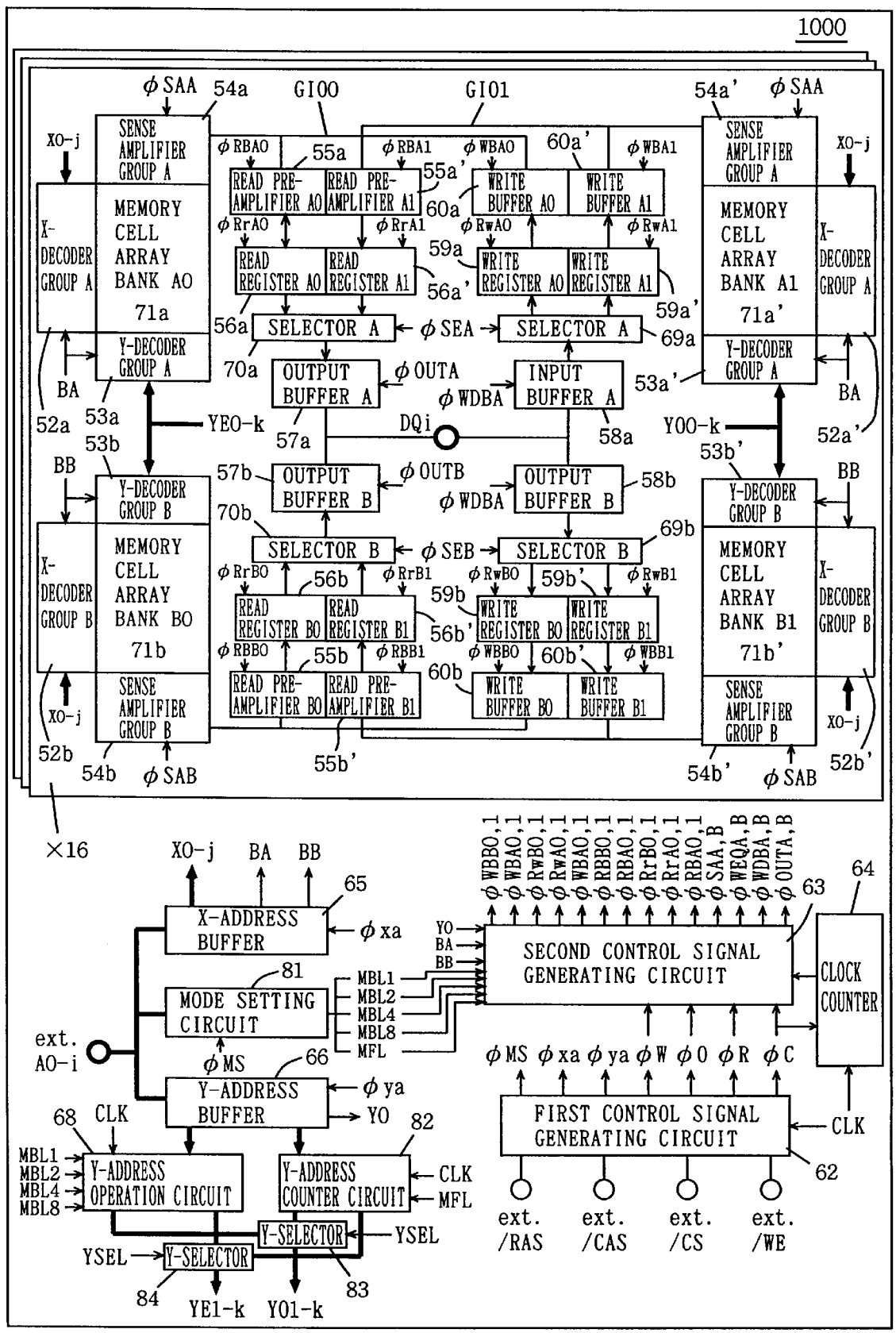
FIG. 1 functionally shows a structure of a major portion of a SDRAM 1000 of an embodiment 1 of the invention.

FIG. 1 is a block diagram functionally showing a structure of a major portion of a SDRAM 1000 of the embodiment 1 of the invention.

More specifically, FIG. 1 shows a structure of a portion functionally related to input/output of data of 1 bit in the SDRAM having a x16-bit structure.

Figure 27:
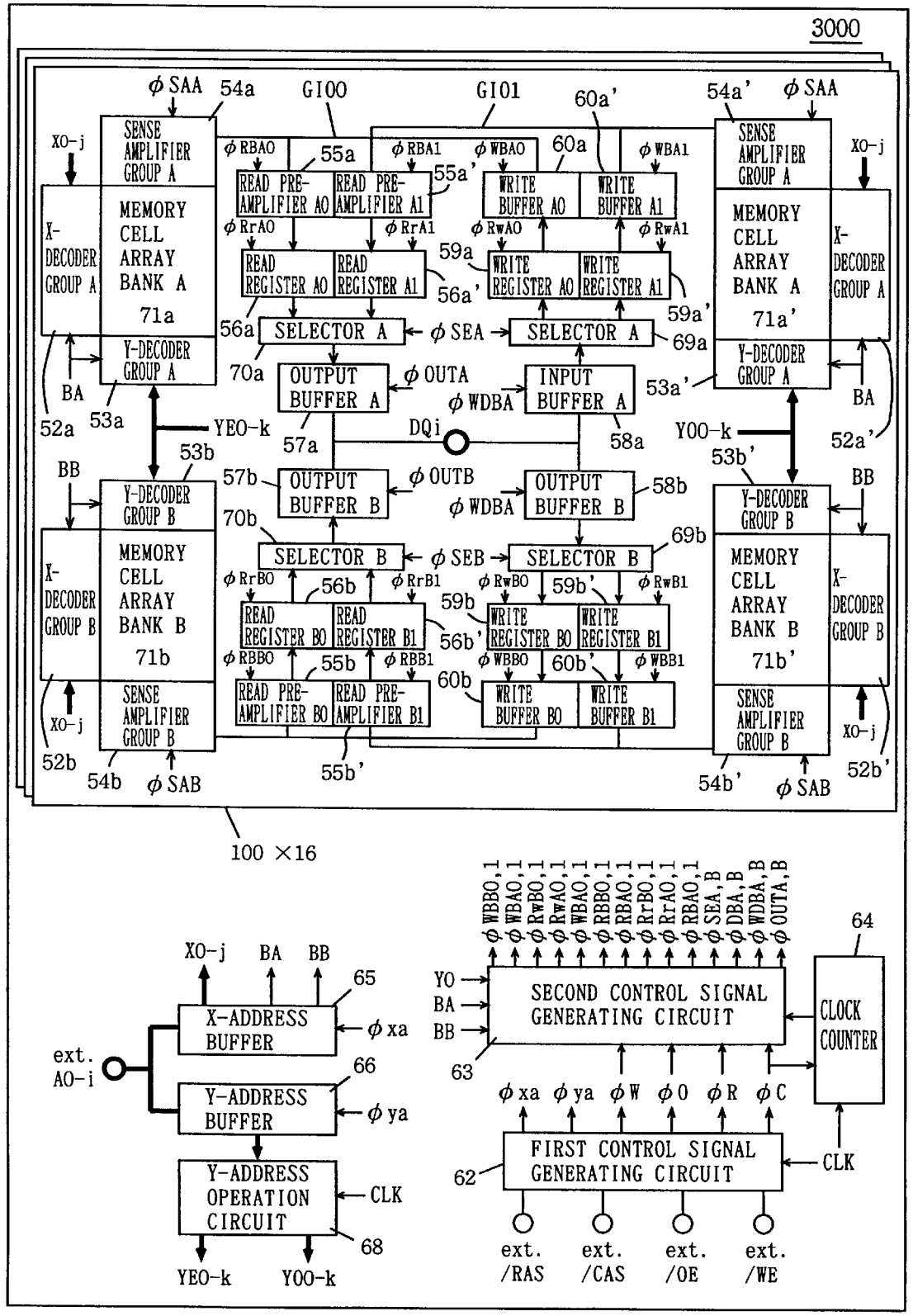
FIG. 27 functionally shows a structure of a major portion of the SDRAM in the prior art.
Figure 28:
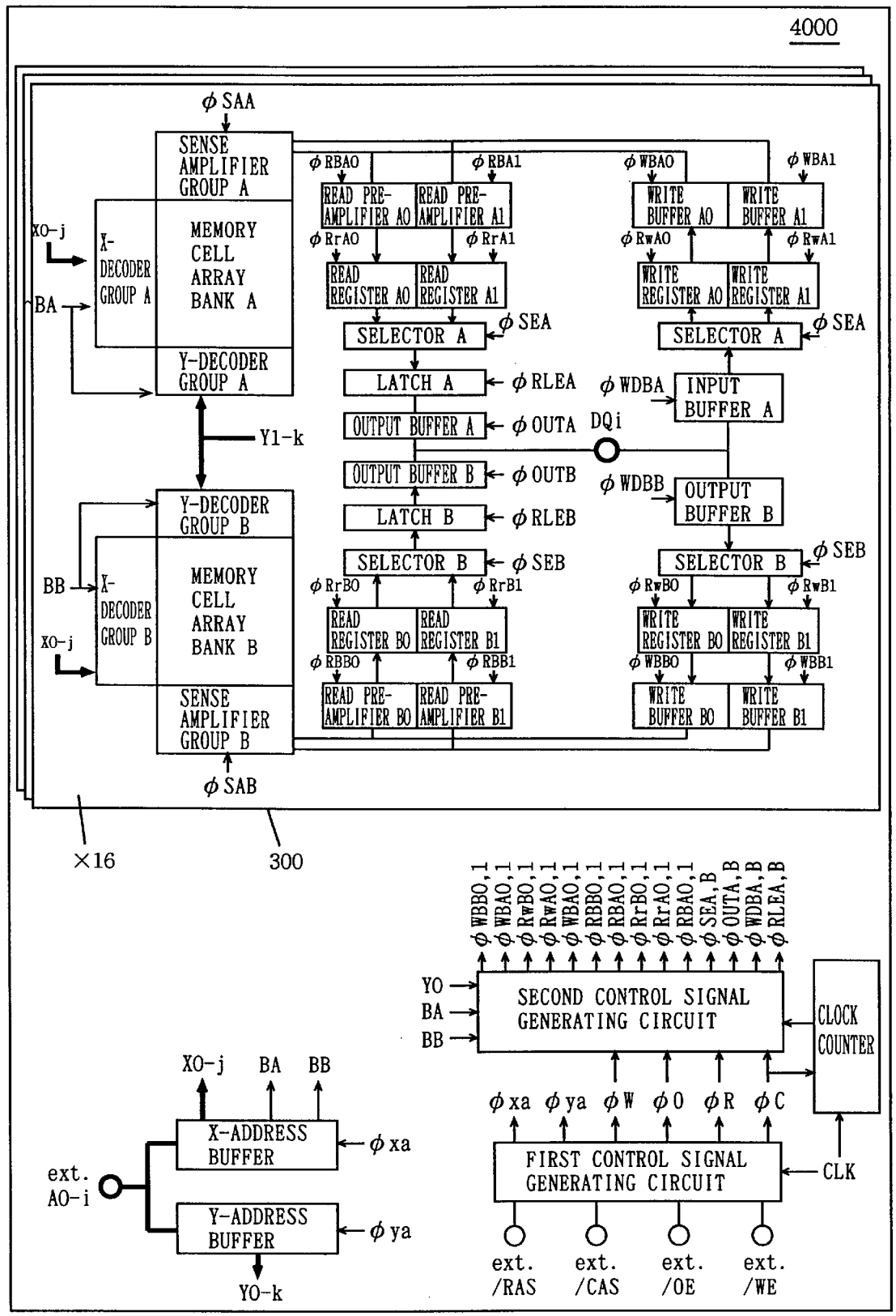
FIG. 28 functionally shows a major portion of the structure of the conventional SDRAM allowing a pipeline operation.

The structure of the SDRAM shown in FIG. 1 is basically the same as that of the functional portion of conventional SDRAM 2000 shown in FIG. 27. The same parts and portions as those in FIG. 27 bear the same reference numbers and will not be described below.

The structure of SDRAM 1000 of the embodiment 1 differs from the structure of conventional SDRAM 2000 in the circuit structure for generating control signals.

Referring to FIG. 1, the control signal generating portion includes an X-address buffer 65, a Y-address buffer 66, a Y-address operation circuit 68, a Y-address counter circuit 82, a mode setting circuit 81, internal column address selectors 83 and 84, a first control signal generating circuit 62, a second control signal generating circuit 63 and a clock counter 64.

First control signal generating circuit 62 takes in the externally supplied control signals, i.e., external row address strobe signal ext./RAS, external column address strobe signal ext./CAS, chip select signal ext./CS and external write enable signal ext./WE in synchronization with external clock signal CLK, and issues internal control signals φMS, φxa, φya, φW, φO, φR and φC.

Second control signal generating circuit 63 is responsive to bank designating signals BA and BB, a lowest bit Y0 of the externally supplied address signal, internal control signals φw, φO, φR and φC, a signal sent from mode setting circuit 81, which will be described later, and the output of clock counter 64, and thereby issues control signals for independently driving banks A and B. More specifically, the second control signal generating circuit 63 issues equalize circuit activating signals φWEQA0 (for bank A0), φWEQA1 (for bank A1), φWEQB0 (for bank B0) and φWEQB1 (for bank B1), sense amplifier activating signals φSAA and φSAB, write buffer activating signals φWBA0, φWBA1, φWBB0 and φWBB1, write register activating signals φRwA0, φRwA1, φRwB0 and φRwB1, selector control signals φSEA and φSEB, input buffer activating signals φWDBA and φWDBB, read preamplifier activating signals φRBA0, φRBA1, φRBB0 and φRBB1, read register activating signals φRrA0, φRrA1, φReB0 and φRrB1, and output buffer activating signals φOUTA and φOUTB.

X-address buffer 65 is responsive to internal control signal φxa to take in external address signals ext./A0 and ext./Ai and issue internal address signals X0–Xj and bank select signals BA and BB.

Y-address buffer 66 is activated in response to internal control signal φya, and thereby issues internal column select signals Y0–Yk for designating the column select line.

Y-address operation circuit 68 is controlled by clock signal CLK to receive the output signal of Y-address buffer 66 and issue column select signals YE1–YEk and YO1–YOk, when the 2-bit prefetch operation is designated in accordance with mode setting signals MBL1–MBL8 sent from mode setting circuit 81.

Y-address counter circuit 82 is controlled by clock signal CLK to issue a column select signal selecting all the columns crossing the selected row, when the page mode is designated in accordance with mode setting signal MFL sent from mode setting circuit 81.

Y-selectors 83 and 84 select and issue the output signals sent from Y-address operation circuit 68 and Y-address counter 82 in accordance with the operation mode, as will be described later.

FIGS. 2 to 6 are circuit diagrams for showing the structure of mode setting circuit 81 shown in FIG. 1.

Figure 2:
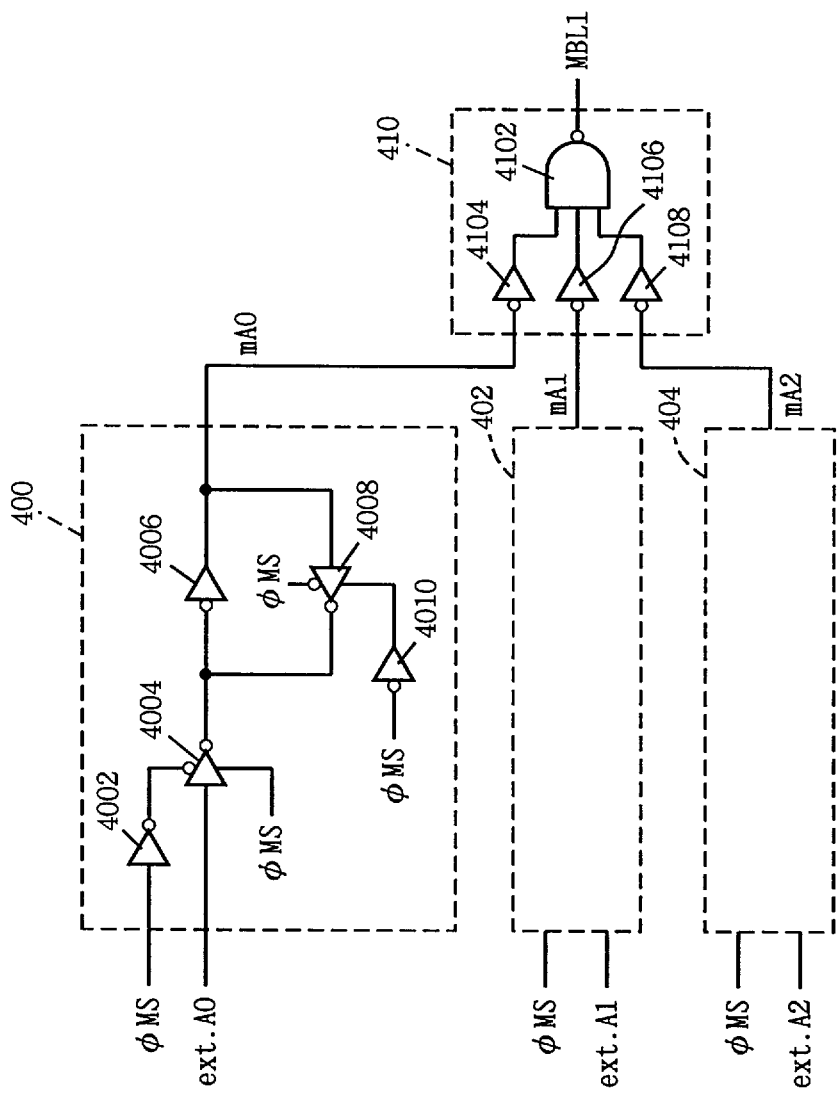
FIG. 2 is a circuit diagram showing a portion of a structure of a mode setting circuit 81 shown in FIG. 1.
Figure 3:
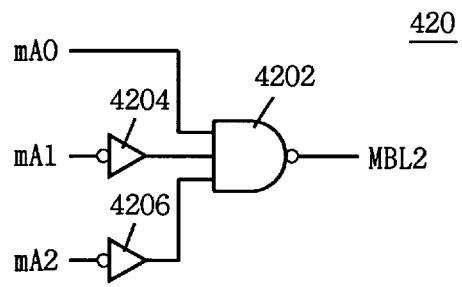
FIG. 3 is a circuit diagram showing another portion of the structure of the setting circuit 81.
Figure 4:
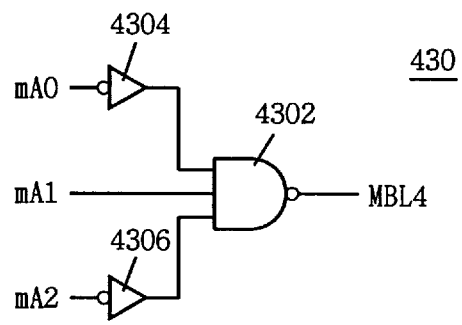
FIG. 4 is a circuit diagram showing still another portion of the structure of the setting circuit 81.
Figure 5:
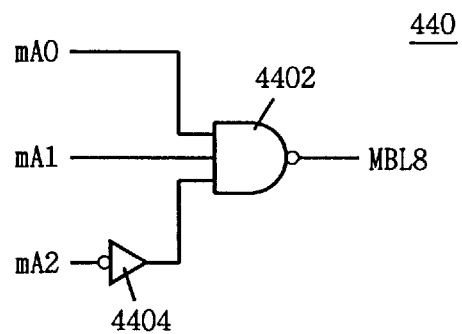
FIG. 5 is a circuit diagram showing yet another portion of the structure of the setting circuit 81.
Figure 6:
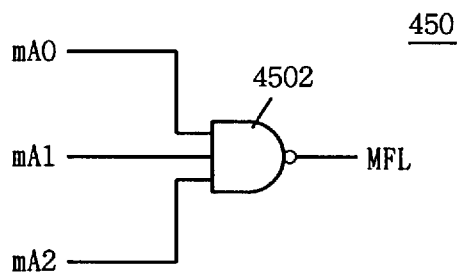
FIG. 6 is a circuit diagram showing further another portion of the structure of the setting circuit 81.

FIG. 2 shows the circuit structure for issuing a control signal MBL1 which is activated when the burst length is 1 bit. FIG. 3 shows the circuit structure for issuing a control signal MBL2 which is activated when the burst length is 2 bits. FIG. 4 shows the circuit structure for issuing a control signal MBL4 which is activated when the burst length is 4 bits. FIG. 5 shows the circuit structure for issuing a control signal MBL8 which is activated when the burst length is 8 bits. FIG. 6 shows a circuit structure for issuing control signal MFL which is activated when the page mode is designated.

Control signals MBL1–MBLB and control signal MFL are determined by combinations of predetermined bit data of the external address signal when all chip select signal /CS, external row address strobe signal ext./RAS, external column address strobe signal ext./CAS and external write enable signal ext./WE are active (at "L" level) at the rising edge of the external clock signal.

More specifically, as shown in FIG. 2, signal φMS attains "H" level when all signals ext./CS, ext./RAS, ext./CAS and ext./WE are active at the rising edge of external clock signal CLK.

The above structure operates as follows when all of lower three bits ext.A0–ext.A2 of the external address signal are "0". In a buffer circuit 400, an output signal mA0 at "L" level is issued from an inverter circuit 4006 which receives an output of a clocked inverter 4004 to be activated in response to activation of signal φMS. Similarly, signals mA1 and mA2 at "L" level are issued from buffer circuits 402 and 404 in accordance with external address signals ext.A1 and ext.A2, respectively.

In each of these buffer circuits 400, 402 and 404, clocked inverter circuit 4008, which is activated in response to change of signal φMS from the active state to the inactive state, and inverter 4006 form the latch circuit, which holds the level of signal mA0, mA1 or mA2 at the foregoing value even after signal φMS is deactivated.

All the outputs of inverters 4104, 4106 and 4108, which receive signals mA0, mA1 and mA2 on their inputs, respectively, attain "H" level. Thereby, an output signal MBL1 of a 2-input AND circuit 4102 receiving signals mA0, mA1 and mA2 on its inputs attains "H" level.

Signal MBL1 is inactive (at "L" level) when lower three bits ext.A0–ext.A2 of the external address signal are at the levels other than those of the foregoing combination.

Referring to FIG. 3, if external address signal exhibits a relationship of (ext.A0, ext.A1, ext.A2) (1, 0, 0) at the time of activation ("H" level) of signal φMS, output signal MBL2 at "H" level is issued from 3-input AND circuit 4202 which receives, on its inputs, signal mA0, the output of an inverter 4204 receiving signal mA1 corresponding to external address signal ext.A1 on its input, and the output of an inverter 4206 receiving signal mA2 corresponding to signal ext.A2 on its input.

Referring to FIG. 4, if a relationship of (ext.A0, ext.A1, ext.A2)=(0, 1, 0) is established at the time of activation of signal φMS, output signal MBL4 at "H" level is issued from 3-input AND circuit 4302 which receives, on its inputs, signal mA1, the output of an inverter 4304 receiving signal mA0 corresponding to external address signal ext.A0 on its input, and the output of an inverter 4306 receiving signal mA2 corresponding to signal ext.A2 on its input.

Referring to FIG. 5, if a relationship of (ext.A0, ext.A1, ext.A2)=(1, 1, 0) is established at the time of activation ("H" level) of signal φMS, output signal MBL8 at "H" level is issued from 3-input AND circuit 4402 which receives, on its inputs, three signals, i.e., signal mA0, signal mA1 and the output of an inverter 4304 receiving signal mA2 corresponding to signal ext.A2 on its input.

Thus, internal control signals MBL1–MBL8 controlling the burst length in the 2-bit prefetch operation can be selectively activated in accordance with the combination of lower bits ext.A0–ext.A2 of the external address signal.

Referring to FIG. 6, if a relationship of (ext.A0, ext.A1, ext.A2)=(1, 1, 1) is established at the time of activation of signal φMS, output signal MFL of 3-input AND circuit 4502, which receives, on its inputs, signal mA0 corresponding to signal ext.A0, signal mA1 corresponding to signal ext.A1 and signal mA2 corresponding to signal ext.A2, is activated and therefore attains "H" level.

When the combination of the lower 3 bits of the external address signal is (1, 1, 1), internal control signal MFL designating the full page mode operation is activated.

Figure 7:
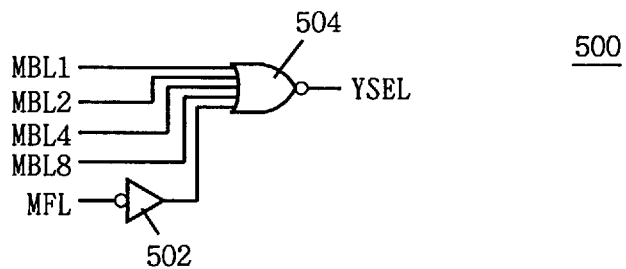
FIG. 7 is a circuit diagram showing a structure of a Y-selector control signal YSEL generating circuit.

FIG. 7 is a circuit diagram showing a structure of a selector control signal generating circuit 500, which is included in a second control signal generating circuit 63 and issues a control signal YSEL for selectively operating Y-selectors 83 and 84.

Selector control signal generating circuit 500 includes a 5-input NOR circuit 504 which receives five input signals, i.e., signals MBL1, MBL2, MBL4 and MBL8 as well as a signal sent from an inverter 502 inverting signal MFL. The output of 5-input NOR circuit 504 is issued as selector control signal YSEL.

Therefore, signal YSEL attains the active state ("H" level) only when all signals MBL1–MBL8 are inactive (at "L" level) and signal MFL is active (at "H" level), and in other words, only when the page mode is designated in accordance with the externally supplied control signals.

Figure 8:
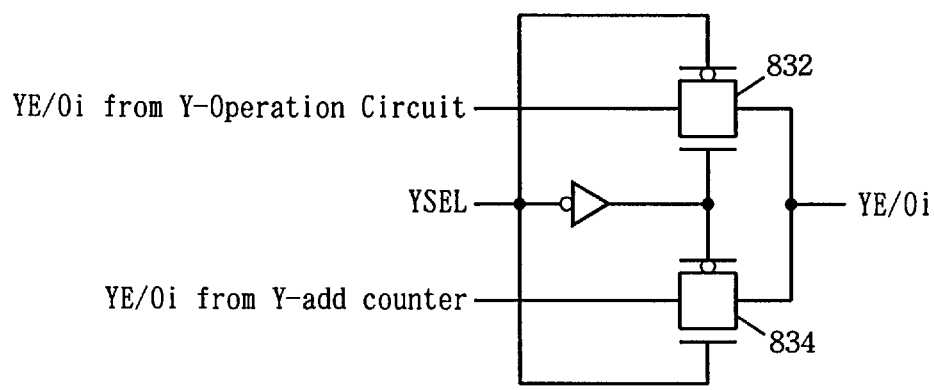
FIG. 8 is a circuit diagram showing a structure of a Y-selector 83.

FIG. 8 is a circuit diagram showing a structure of Y-selector 83 or 84. Y-selectors 83 and 84 have the same circuit structures.

Y-selector circuit 83 includes a transmission gate 832 which receives the output of Y-address operation circuit 68 and is turned on in response to the inactive state ("L" level) of signal YSEL, and a transmission gate 834 which receives the output of Y-address counter circuit 82 and is turned on in response to the active state ("H" level) of signal YSEL. Therefore, Y-selector circuit 83 issues the output of Y-address counter circuit 82 in the page mode, and issues the output of Y-address operation circuit 68 in the mode other than the page mode.

[Circuit Structure for 2-bit Prefetch Operation]

Figure 9:
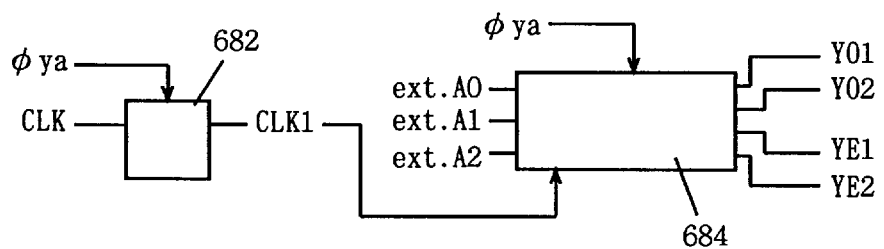
FIG. 9 is a schematic block diagram showing a structure of a Y-address operation circuit 68.

FIG. 9 is a schematic block diagram showing a structure of Y-address operation circuit 68 shown in FIG. 1.

Y-address operation circuit 68 includes a clock frequency doubling circuit 682, which receives clock signal CLK issued from an internal clock signal generating circuit (not shown) and control signal φya in accordance with external clock signal ext.CLK, and issues a signal CLK1 prepared by doubling the frequency of clock signal CLK, and column address generating circuit 684 which is controlled by clock signal CLK1 and signal φya, and issues odd-numbered column signals YO1 and YO2 as well as even-numbered column signals YE1 and YE2 in accordance with the values of external address signals ext.A0, ext.A1 and ext.A2 at the time of activation of signal φya.

Figure 10:
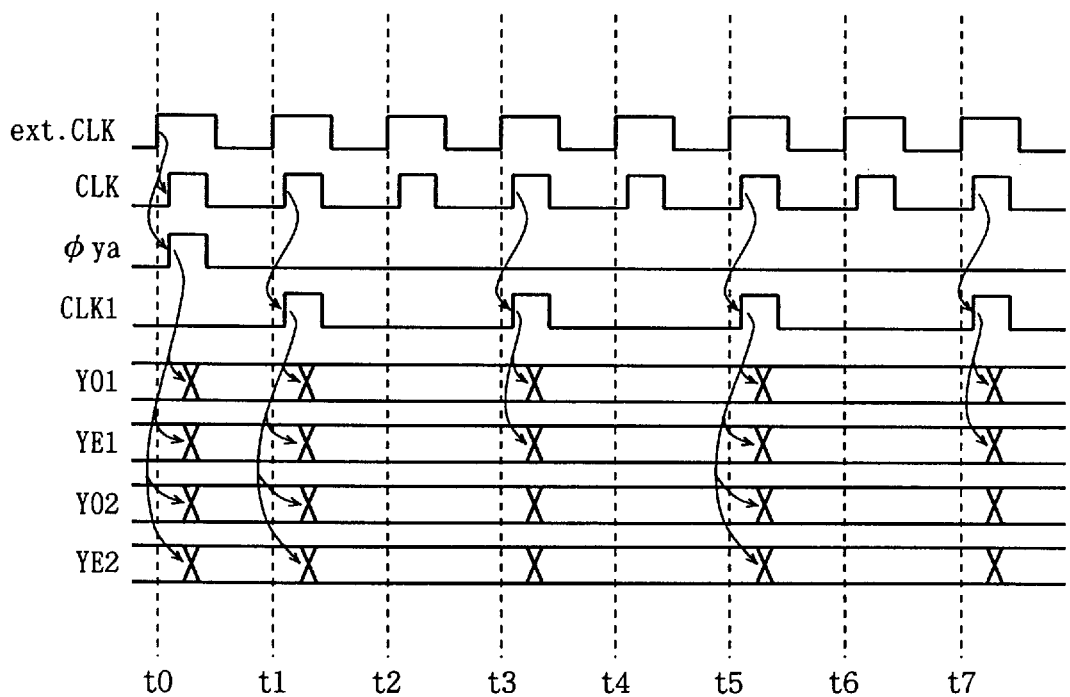
FIG. 10 is a timing chart showing an operation of a column address generating circuit 684.

FIG. 10 is a timing chart showing an operation of clock frequency doubling circuit 682 and column address generating circuit 684 shown in FIG. 9.

In response to the rising edge of external clock signal ext.CLK at time t0, internal clock signal CLK is activated to attain "H" level. If the prefetch operation is designated, internal control signal φya is activated to attain "H" level in response to the rising edge of external clock signal ext.CLK at time t0. In response to this, clock frequency doubling circuit 682 starts the operation of counting clock signal CLK. Also, column address generating circuit 684 issues column select signals YO1, YO2, YE1 and YE2 corresponding to external address signals ext.A0–ext.A2 in response to the rising edge of signal φya.

Column select signals YO1 and YO2 for designating the column address at an odd-numbered position are provided for selecting the corresponding columns, e.g., in memory cell array bank A1, and are always equal to the values of externally supplied address signals ext.A1 and ext.A2, respectively. Column address select signals YE1 and YE2 for designating the even-numbered column addresses are equal to the values of externally supplied column address signals ext.A1 and ext.A2 when the externally supplied column address signal ext.A0 is at "L" level and the column address designates an even-numbered position. However, signals YE1 and YE2 correspond to values incremented by one, respectively, when externally supplied column address signal ext.A0 is at "H" level and the address designates an odd-numbered position. For example, when all column address signals ext.A0, ext.A1 and ext.A2, which are taken in at the time of activation of column address strobe signal /CAS, are 0, all signals YO1 and YO1 as well as signals YE1 and YE2 are 0.

When the address signals exhibit a relationship of (ext.A0, ext.A1, ext.A2)=(1, 0, 1), relationships of YO1=YO2=0, YE1=1 and YE2=0 are exhibited.

When the burst length of, e.g., 4 and signals exhibit a relationship of (ext.A0, ext.A1)=(1, 1), the relationships of YO1=1 and YE1=0 are achieved and YO2 and YE2 take on the values equal to those of externally supplied column address signal ext.A2.

FIG. 11 shows a relationship in value between address signals (ext.A0 and ext.A1) and signals YO1 and YE1 at time t0 in FIG. 10 with the burst length of 4, and also shows changes in values of YO1 and YE1 between times t1–t3 in FIG. 10.

When the burst length of 8 and externally supplied column address signals exhibit (ext.A0, ext.A1, ext.A2)=(1, 1, 0), relationships of YO1=1, Y0=2, YE1=0 and YE=1 are achieved.

FIG. 12 shows a relationship in value between address signals (ext.A0, ext.A1 and ext.A2) and signals YO1, YO1 and YE2 at time t0 in FIG. 10 in the case of the burst length of 8, and also shows changes in values of YO1, YO2, YE1 and YE2 between times t1–t7 in FIG. 10.

Referring again to FIGS. 10, 11 and 12, internal clock signal CLK is activated in response to the rising edge of external clock signal ext.CLK at time t1, and thereby clock frequency doubling circuit 682 activates internal clock signal CLK1 to attain "H" level.

In accordance with activation of signal CLK1, signals YO1, YO2, YE1 and YE2 change from values, which were set by address signals (ext.A0, ext.A1, ext.A2) received at time t0 and corresponding to the designated burst length, to the values shown in FIG. 11 or 12.

However, as already described, values of signals YO2 and YE2 do not change and are equal to the value of externally supplied column address signal ext.A2 when the burst length is 4. Final changes in YO1, TO2, YE1 and YE2 at time t3 do not relate to the actual operation in the case of the burst length of 4.

When the burst length is 4 (signal MBL4 is 1), two addresses are selected in each of banks A0 and A1 in the foregoing manner, and data of 4 bits in total are read out through each data I/O terminal DQi, as will be described later.

When the burst length is 8 (signal MBL8 is 1), internal clock signal CLK is further activated in response to the rising edges of external clock signal ext.CLK at times t3 and t5, and thereby clock frequency doubling circuit 682 activates internal clock signal CLK1 to attain "H" level at each of times t3 and t5.

In response to activation of signal CLK1, the last values of signals YO1, YO2, YE1 and YE2 change at times t3 and t5 as shown in FIG. 12.

Finally, YO1, YO2, YE1 and YE2 also change at time t7. However, this does not relate to an actual operation.

Figure 13A:
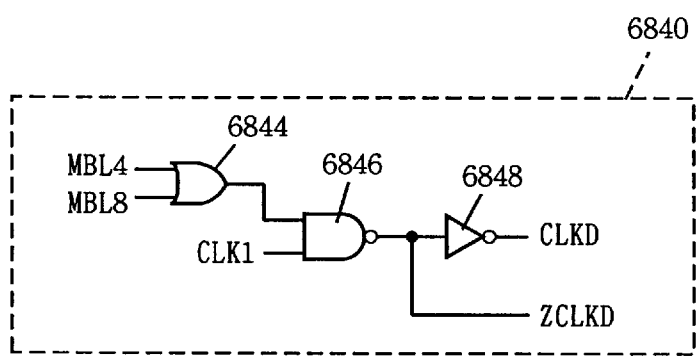
FIGS. 13A and 13B are circuit diagrams showing portions of structures of a column address generating circuit 684 in the Y-address operation circuit.
Figure 13B:
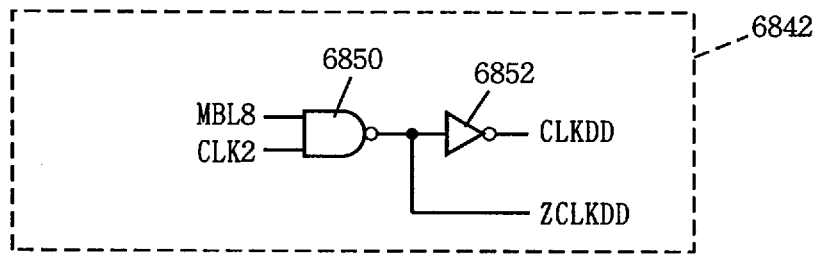

FIG. 13 is a circuit diagram showing a structure in column address generating circuit 684, and particularly structures of a first control clock generating circuit 6840 issuing internal control clock signals CLKD and ZCLKD as well as a second control clock generating circuit 6842 issuing internal control clock signals CLKDD and ZCLKDD.

First control clock generating circuit 6840 includes an OR circuit 6844 receiving signals MBL4 and MBL8 on its inputs, a NAND circuit 6846 which receives the output of OR circuit 6844 and signal CLK1 sent from the clock frequency doubling circuit, and issues internal control clock signal ZCLKD, and an inverter 6848 which receives the output of NAND circuit and issues signal CLKD.

Second control clock generating circuit 6842 includes a NAND circuit 6850 which receives signals MBL8 and CLK1 on its inputs, and issues signal ZCLKDD, and an inverter 6852 which receives the output of NAND circuit 6850 and issues signal CLKDD.

FIG. 14 shows a structure in column address generating circuit 684 shown in FIG. 9, and particularly structures of circuits which are controlled by internal control clock signals CLKD, ZCLKD, CLKDD and ZCLKDD to perform input/output of column select signals YO1, YO2, YE1 and YE2.

A first odd-numbered column select signal generating circuit 6860 receives external address signal ext.A1 and issues odd-numbered column select signal YO1 under the control by signal φya and signals CLKD and ZCLKD.

More specifically, first odd-numbered column select signal generating circuit 6860 includes an inverter 6870 receiving external address signal ext.A1, a clocked inverter circuit 6872 which receives the output of inverter 6870 and is activated in accordance with activation of signal φya, a latch circuit 6874 receiving and holding the output of clocked inverter circuit 6872, an inverter 6876 which receives the output of latch circuit 6874 and issues signal YO1, a clocked inverter 6878 which receives signal YO1 and is activated in accordance with activation of signal ZCLKD (signal CLKD is inactive and at "L" level), a latch circuit 6880 receiving and holding the output of clocked inverter 6878, and a clocked inverter circuit 6882 which receives the output of latch circuit 6880, and is activated in accordance with activation of signal CLKD (signal ZCLKD is inactive and at "L" level) to apply its output signal to latch circuit 6874.

Second odd-numbered column select circuit 6862 receives external address signal ext.A2 and first odd-numbered column select signal YO1, and issues second odd-numbered column select signal YO2 under the control by signal φya and signals CLKDD and ZCLKDD.

Second odd-numbered column select signal generating circuit 6862 includes an inverter 6890 receiving external address signal ext.A2, clocked inverter circuit 6892 which receives the output of inverter 6890 and is activated in response to activation of signal φya, a latch circuit 6894 receiving and holding the output of clocked inverter circuit 6892, and an inverter 6896 receiving the output of latch circuit 6894 and issuing signal YO2.

Second odd-numbered column select signal generating circuit 6862 further includes a NAND circuit 6900 receiving signals YO1 and YO2, inverters 6902 and 6904 receiving and inverting signals YO1 and YO2, respectively, a NAND circuit 6906 receiving the outputs of inverters 6902 and 6904 on its inputs, a NAND circuit 6908 receiving the outputs of NAND circuits 6900 and 6906, a clocked inverter circuit 6910 which receives the output of NAND circuit 6908 and is activated in response to activation ("H" level) of signal ZCLKDD, a latch circuit 6912 receiving and holding the output of clocked inverter circuit 6910, and a clocked inverter circuit 6914 which receives the output of latch circuit 6912, and is activated in response to activation ("H" level) of signal CLKDD to apply its output to latch circuit 6894.

First even-numbered column select signal generating circuit 6864 receives external address signals ext.A0 and ext.A1, and issues even-numbered column select signal YE1 under the control by signal φya and signals CLKD and ZCLKD.

First even-numbered column select signal generating circuit 6864 includes a NAND circuit 6920 receiving external address signals ext.A0 and ext.A1, inverters 6922 and 6924 receiving and inverting external address signals ext.A0 and ext.A1, respectively, a NAND circuit 6926 receiving the outputs of inverters 6922 and 6924, a NAND circuit 6928 receiving the outputs of NAND circuits 6920 and 6926, a clocked inverter circuit 6930 which receives the output of NAND circuit 6928 and is activated in response to activation of signal φya, a latch circuit 6932 receiving and holding the output of clocked inverter circuit 6903, an inverter 6934 receiving the output of latch circuit 6932 and issuing signal YE1, a clocked inverter circuit 6936 which receives signal YE1 and is activated in response to activation of signal ZCLKD, a latch circuit 6938 receiving and holding the output of clocked inverter circuit 6936, and a clocked inverter circuit 6940 which receives the output of latch circuit 6938 and is activated in response to activation of signal CLKD to apply its output to latch circuit 6932.

Second even-numbered column select signal generating circuit 6866 receives external address signals ext.A0, ext.A1 and ext.A2 as well as signal YE1, and issues second even-numbered column select signal YE2 under the control by signal φya and signals CLKDD and ZCLKDD.

Second even-numbered column select signal generating circuit 6866 includes a NAND circuit 6950 receiving external column address signals ext.A0 and ext.A1, an inverter 6952 receiving and inverting the output of NAND circuit 6950, a NAND circuit 6954 receiving the output of inverter 6952 and external address signal ext.A2 on its inputs, an inverter 6956 receiving and inverting signal ext.A2, a NAND circuit 6958 receiving the outputs of NAND circuit 6950 and inverter 6956 on its inputs, a NAND circuit 6960 receiving the outputs of NAND circuits 6954 and 6958, a clocked inverter 6962 which receives the output of NAND circuit 6960 and is activated in response to activation of signal φya, a latch circuit 6964 receiving and holding the output of clocked inverter 6962, and an inverter 6966 receiving and inverting the output of latch circuit 6964 to issue signal YE2.

Second even-numbered column select signal generating circuit 6866 further includes a NAND circuit 6968 receiving signals YE1 and YE2, inverters 6970 and 6972 receiving and inverting signals YE1 and YE, respectively, a NAND circuit 6974 receiving the outputs of inverters 6970 and 6972, a NAND circuit 6976 receiving the outputs of NAND circuits 6968 and 6974, a clocked inverter 6978 which receives the output of NAND circuit 6976 and is activated in response to activation of signal ZCLKDD, a latch circuit 6980 receiving and holding the output of clocked inverter 6978, and a clocked inverter 6982 which receives the output of latch circuit 6980, and is activated in response to activation of signal CLKDD to apply its output to latch circuit 6964.

Then, brief description will be given on operations of first and second odd-numbered column select signal generating circuits 6860 and 6862 as well as first and second even-numbered column select signal generating circuits 6864 and 6866.

As already described with reference to FIG. 13, control clock generating circuit 6840 issues mutually complementary control clock signals CLKD and ZCLKD in accordance with signal CLK1 when the burst length of 4 or 8 is designated and therefore signals MBL4 or 8 is active.

Therefore, when the burst length of 4 or 8 is designated, first odd-numbered column select signal generating circuit 6860 stores the value of external address signal ext.A1 in latch circuit 6874 in accordance with activation of signal φya. In this cycle, as already described with reference to FIG. 10, signal CLK1 is inactive, signals CLKD and ZCLKD are at "L" and "H" levels, respectively, and clocked inverter circuit 6878 is active. Therefore, latch circuit 6880 holds the value obtained by inverting external address signal ext.A1 held in latch circuit 6874. Subsequently, signal CLK1 is activated in response to rising of external clock signal ext.CLK, and thereby levels of signals ZCLKD and CLKD change into "L" and "H" levels, respectively. In response to this, data held in latch circuit 6880 is applied to latch circuit 6874 after the value thereof is inverted by clocked inverter circuit 6882. Therefore, the value which was initially held in latch circuit 6874 is inverted and thereby signal YO1 is issued.

The above operation corresponds to such an operation in FIG. 10 that signal YO1 holds the value of external address signal ext.A1 in the cycle between times t0 and t1, and this value is inverted in the cycle between times t1 and t2.

Second odd-numbered column select signal generating circuit 6862 stores the value of external address signal ext.A2 in latch circuit 6894 in accordance with activation of signal φya, and thereby issues signal YO2 from inverter 6896. In this point of time, therefore, the value of signal YO2 is equal to the value of external address signal ext.A2.

The signal issued from NAND circuit 6908 attains "H" level only when both signals YO1 and YO2 attain "0" level or "1" level.

In the cycle between times t0 and t1 shown in FIG. 10, clocked inverter circuit 6910 is active in response to the fact that signal CLK1 is inactive and signal CLKD is also inactive.

Therefore, when first odd-numbered column select signal generating circuit 6860 issues output YO1 at "0" level, latch circuit 6912 holds the inverted signal of output YO2 of inverter 6896. When first odd-numbered column select signal 6860 issues output YO1 at "1" level, latch circuit 6912 holds the value at the same level as output YO2 of inverter 6896.

When external clock signal ext.CLK rises in the cycle between times t0 and t1 shown in FIG. 10, signal CLK1 is activated, and the levels of signals ZCLKD and CLKD change into "L" and "H", respectively, so that clocked inverter 6914 is activated. Thereby, data held in latch circuit 6912 is issued through latch circuit 6894 and inverter 6896 as signal YO2.

In the first even-numbered column select signal generating circuit 6864, the signal issued from NAND circuit 6928 attains "H" level only when both signals ext.A0 and ext.A1 are at "0" level or "1" level.

When external address signal ext.A0 is at "0" level and the external address signal is an even number, latch circuit 6932 holds the signal obtained by inverting external address signal ext.A1, and external address signal ext.A1 itself is issued as signal YE1. When external address ext.A0 is "1" and the external column address is an odd number, latch circuit 6932 holds the data at the same level as signal ext.A1, and the level obtained by inverting signal ext.A1 is issued as signal YE1.

In the cycle between times t0 and t1 in FIG. 10, this initially set value of signal YE1 is held also in latch circuit 6938 because signal CLK1 is inactive and signal CLKD is also inactive so that clocked inverter circuit 6936 is active.

In response to activation of signal CLK1 in the subsequent cycle between times t1 and t2 in FIG. 10, data held in latch circuit 6938 is inverted and applied to latch circuit 6932 because clocked inverter circuit 6940 is activated.

Thus, the level of signal YE1 is inverted in the cycle between times t0 and t1 in FIG. 10. Thereafter, the value of first column select signal YE1 is successively inverted in accordance with activation of signal CLK1.

An operation of second even-numbered column select signal generating circuit 6866 will now be described below.

FIG. 15 shows a structure in second even-numbered column select signal generating circuit 6886, and particularly shows a relationship of the level of the signal issued from NAND circuit 6960 with respect to external address signals ext.A0, ext.A1 and ext.A2. The value of this signal is inverted and held in latch circuit 6964 in accordance with activation of signal φya, and is further inverted by inverter 6966 into a value, which is equal to the inverted value of the output of NAND circuit 6960. The value thus inverted is issued as signal YE2.

Referring to FIG. 15, when external address signal ext.A0 is "0" and the external column address is an even number, signal YE2 is equal to the value of signal ext.A2.

When signal ext.A0 is "1" and the external column address is an odd number, signal YE2 is equal to the value of signal ext.A2 in the case where the value represented by address values ext.A0, ext.A1, ext.A2 is incremented by one.

In the above manners, signals YO0, YO1, YE1 and YE2 change their values from the initially set values as shown in FIGS. 10 to 12.

Figure 16:
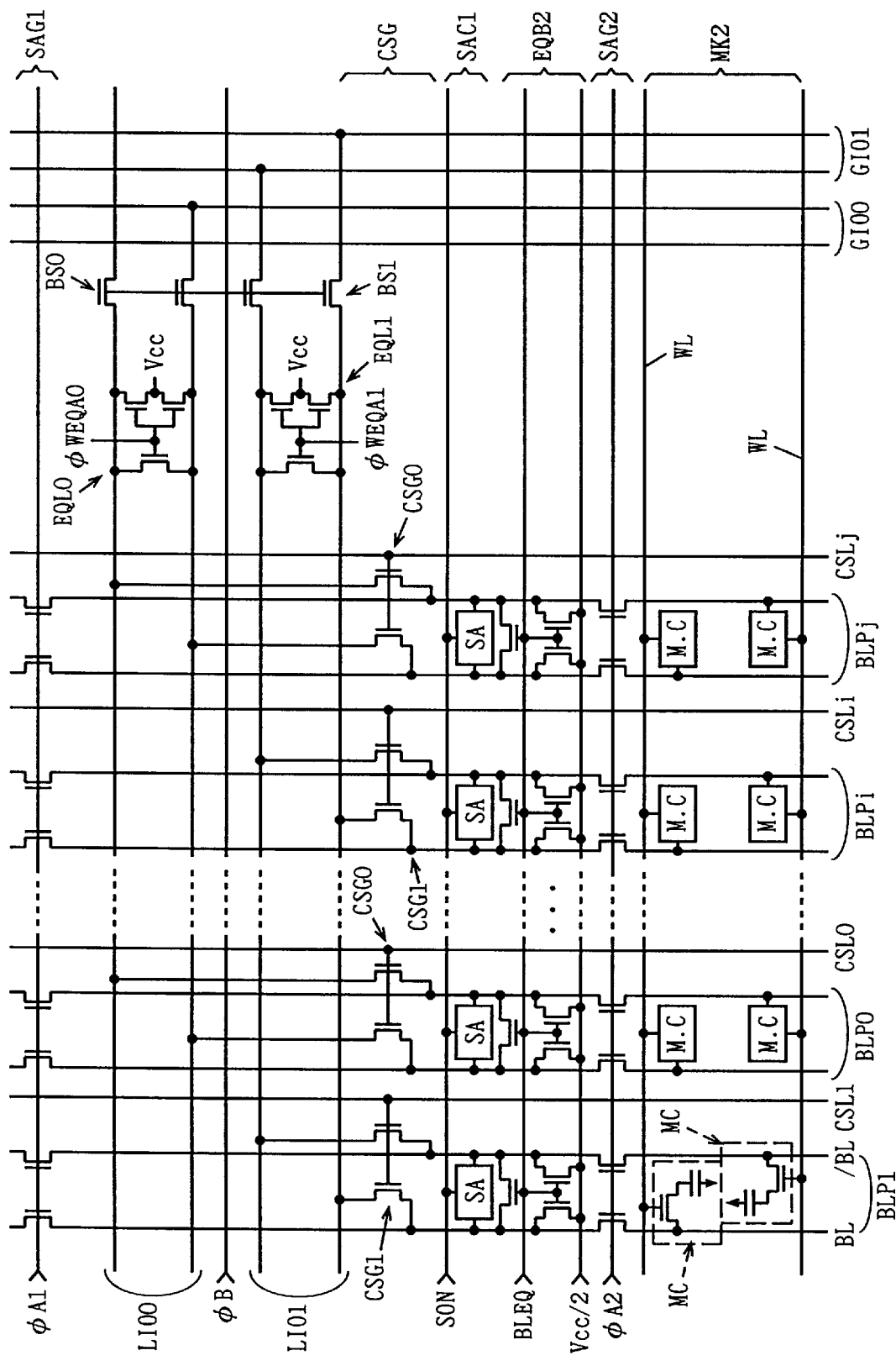
FIG. 16 is a circuit diagram showing a structure including memory cell columns and I/O line pairs in the SDRAM 1000.

FIG. 16 is a circuit block diagram showing a structure of SDRAM 1000 of the embodiment 1 of the invention, and more specifically structures of the memory cell array, local I/O line pairs for reading data from the memory cell array and global I/O line pairs.

There are provided two global I/O line pairs GIO0 and GIO1, two local I/O line pairs LIO0 and LIO1, and two clock select switches BS0 and BS1. For two local I/O line pairs LIO0 and LIO1, there are arranged two local I/O line pair equalize circuits EQL0 and EQL1 which are controlled by signals φWEQA0 and φWEQA1 independently of each other, respectively.

For two bit line pairs BLPi and BLPj, there are arranged column select lines CSLi and CSLj, respectively. Bit line pair BLPi selected by column select line CSLi belongs to, e.g., memory cell array bank A0, and bit line pair BLPj selected by column select line CSL1 belongs to, e.g., memory cell array bank A1.

Thus, the memory cell array is divided into memory cell array bank A0 formed of columns at even-numbered positions and memory cell array bank A1 formed of columns at odd-numbered positions.

Bit line pair BLPi is connected to local I/O line pair LIO0 through a column select gate CSG0, and bit line pair BLPj is connected to local I/O line pair LIO1 through a column select gate CSG1.

Local I/O line pair LIO0 is further connected to global I/O line pair GIO0 through block select switch BS0, and local I/O line pair LIO1 is connected to global I/O line pair GIO1 through block select switch BS1.

As already described with reference to FIG. 1, global I/O line pair GIO0 is connected to read preamplifier 55a, and global I/O line pair GIO1 is connected to read preamplifier 55a'.

Figure 17:
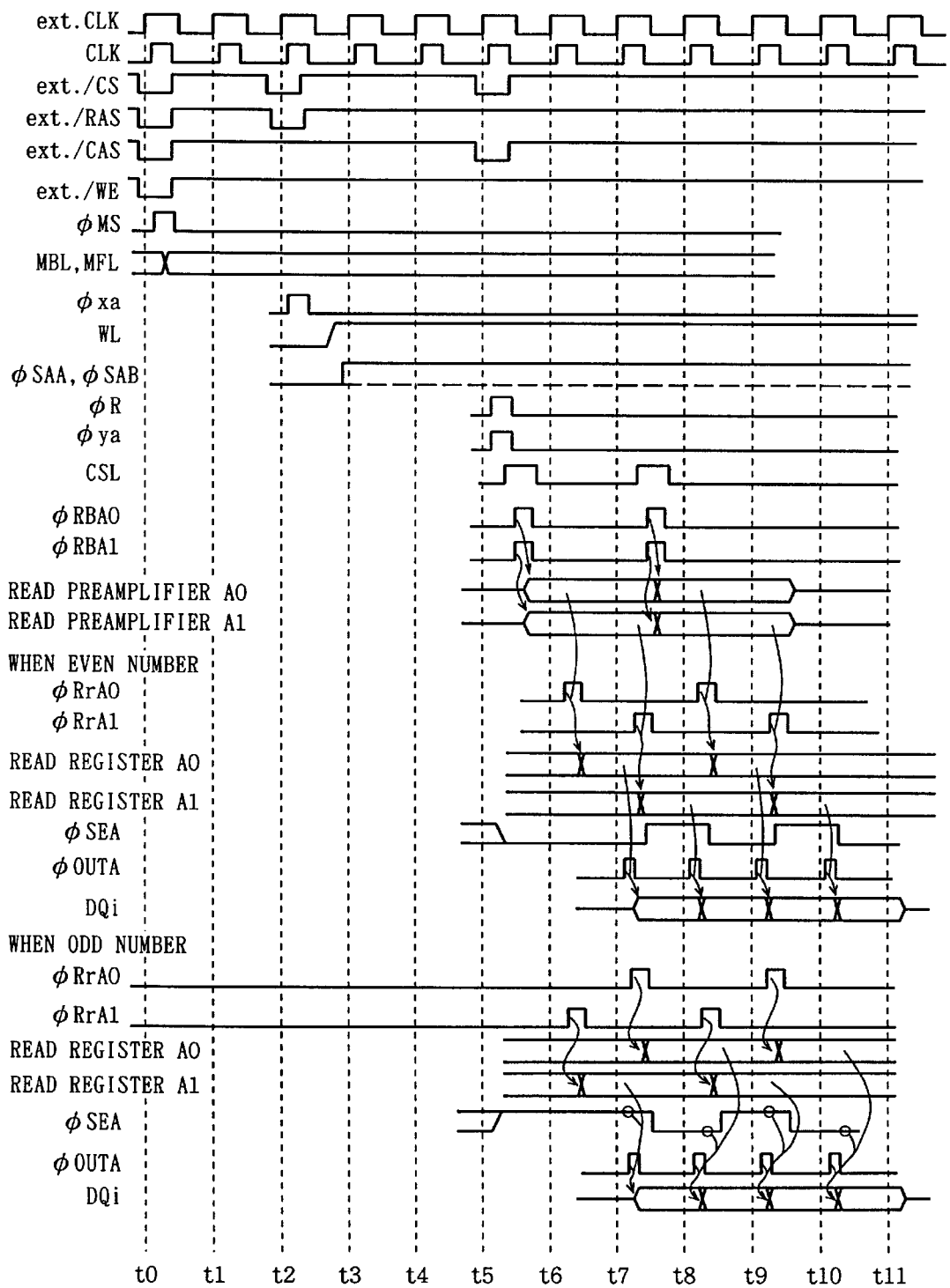
FIG. 17 is a timing chart showing a 2-bit prefetch operation of the SDRAM 1000.

FIG. 17 is a timing chart for showing the 2-bit prefetch operation of the SDRAM of the embodiment 1.

At time t0, the first control signal generating circuit shown in FIG. 2 activates control signal φMS to attain "H" level in response to the fact that all chip select signal ext./CS, external row address strobe signal ext./RAS, external column address strobe signal ext./CAS and external write enable signal ext./WE are active (at "L" level) at the rising edge of external clock signal ext.CLK.

As already described with reference to FIGS. 2 to 6, the burst length is set in accordance with the combination of external address signals ext.A0–ext.A2 at the time of acti-vation of signal φMS. Thus, the burst length is selectively set to 1 bit, 2 bits, 4 bits, 8 bits or the value for the full page operation mode in accordance with the combination of external address signals ext.A0–ext.A2.

A CAS latency, which is the number of cycles from activation of CAS to start of output of data, is determined by the value of ext.A4, ext.A5, ext.A6 in the mode set cycle (i.e., when control signal φMS attains "H" level and all chip select signal ext./CS, external row address strobe signal ext./RAS, external column address strobe signal ext./CAS and external write enable signal ext./WE are at "L" level at the rising of external clock signal ext.CLK).

For example, in the case of (ext.A4, ext.At, ext.A6)=(1, 0, 0), the CAS latency of 1 is designated. In the case of (ext.A4, ext.At, ext.A6)=(0, 1, 0), the CAS latency of 2 is designated. In the case of (ext.A4, ext.At, ext.A6)=(1, 1, 0), the CAS latency of 3 is designated.

In the following description, it is assumed that the CAS latency of 3 is designated.

At the rising edge of external clock signal ext.CLK at time t2, both chip select signal ext./CS and external row address strobe signal ext./RAS are active ("L" level), and external write enable signal ext./WE and external column address strobe signal ext./CAS are inactive. In response to this, the bank activating mode is designated, and the first control signal generating circuit shown in FIG. 1 activates internal control signal φxa. In response to this, potential level WL on the word line, which is selected in the selected bank in accordance with the externally applied address signal, changes into the selected state ("H" level). Thereafter, sense amplifier activating signal φSAA or φSAB is activated ("H" level), and the sense amplifier amplifies the data sent from the selected memory cell.

At the subsequent rising edge of external clock signal ext.CLK at time t5 (corresponding to time t0 in FIG. 10), both chip select signal ext./CS and external column address strobe signal ext./CAS are active ("L" level), and signals ext./RAS and ext./WE are at "H" level. In response to this, operations are performed for taking in the external column address and outputting data. For this, the first control signal generating circuit shown in FIG. 1 activates both internal control signals φR and φya.

In accordance with activation of signal φya, odd-numbered column select signals YO1 and YO2 as well as even-numbered column select signals YE1 and YE2 are set to values corresponding to the selected column, as already described with reference to FIGS. 10 to 12.

In connection with the above, it is assumed that ext.A0 is 0 and therefore the even-numbered address is designated as the start address of the column. In this case, Y0 issued from the Y-address buffer attains "L".

In accordance with this, Y-decoder groups 53a and 53a' each activate one selected column select signal CSL in corresponding memory cell array bank 71a or 71a', and data sensed by the sense amplifiers are output onto global I/O line pairs GIO0 and GIO1.

Since both read preamplifier activating signals φRBA0 and φRBA1 issued from the second control signal generating circuit shown in FIG. 1 attain the active state, read data sent onto the global I/O line pairs are amplified and are applied to input nodes of read registers 56a and 56a'.

If signal ext.A0 was at "L" designating the even-numbered address as the start address of the column at time t5, such an operation is performed at time t6 that read register activating signal φRrA0 issued from second control signal generating circuit 63 is activated at the rising edge of external clock signal ext.CLK, and thereby the data amplified by read preamplifier 55a is stored in read register 56a.

In response to the rising edge of external clock signal ext.CLK at time t7, read register activating signal φRrA1 issued from second control signal generating circuit 63 is activated, and read data issued from read preamplifier 55a' is stored in read register 56a' in response to this activation of signal φRrA1.

At time t7, selector 70a receives the signal issued from read register 56a and sends the same to output buffer 57a in response to the fact that selector control signal φSEA is at "L" level. Thereby, output buffer 57a outputs the read data stored in read register 56a to data I/O terminal DQi in response to activation of output buffer activating signal φOUTA issued from second control signal generating circuit 63.

In the cycle between times t6 and t7, values of odd-numbered column select signal YO1 and even-numbered column select signal YE1 are renewed so that corresponding column select signal CSL becomes active in the cycle between times t7 and t8. The data read from the column thus selected are amplified by read preamplifiers 55a and 55a' in response to the reactivation of read preamplifier activating signals φRBA0 and φRBA1, respectively.

At the rising edge of external clock signal ext.CLK at time t8, selector 70a selects the second read data held in read register 56a' and applies the same to output buffer 57a in response to the "H" level of selector control signal φSEA. Output buffer 57a issues the second read data to the corresponding data I/O terminal DQi in response to activation of output buffer activating signal φOUTA.

In the cycle between times t7 and t8, data is amplified by read preamplifier 55a. In the cycle between times t8 and t9, this data is stored in read register 56a in response to activation of read register activating signal φReA0 issued from second control signal generating circuit 63.

At time t9, i.e., the rising edge of external clock signal ext.CLK, selector 70a selects third read data stored in read register 56a and applies the same to output buffer 57a in response to the "L" level of selector control signal φSEA. Output buffer 57a issues the third read data to corresponding data I/O terminal DQi in response to activation of output buffer control signal φOUTA.

In the cycle between times t9 and t10, fourth read data amplified by read preamplifier 55a' is stored in read register 56a' in response to activation of read register activating signal φRrA1 issued from second control signal generating circuit 63.

At time t10, i.e., the rising edge of external clock signal ext.CLK, the selector circuit selects fourth read data stored in read register 56a' and applies the same to output buffer 57a in response to the "H" level of select signal φSEA. Output buffer 57a issues the fourth read data stored in read register 56a' to data I/O terminal DQi in response to activation of output buffer activating signal φOUTA.

When ext.A0 is equal to 1 and thus an odd-numbered address is designated as the start address of the column at the time of activation of signal φya between times t5 and t6, Y0 attains "H", and the order of cycles of change in signals φRBA0 and φRBA1 as well as change in signal φSEA become opposite to those in the case where an even-numbered address is designated.

Thereby, signal φRrA1 is activated in a period between times t6 and t7, and data of read preamplifier A1 is stored in read register A1.

Between times t7 and t8, signal φRrA0 is activated, and data of read preamplifier A0 is taken into read register A0.

Signal φSEA remains at "H" until signal φOUTA is deactivated between times t7 and t8, and data in read register A1 is issued to data I/O terminal DQi in synchronization with signal φOUTA between times t7 and t8.

When signal φOUTA is activated between times t8 and t9, signal φSEA is at "L" level, and data in read register A0 is issued to data I/O terminal DQi in synchronization with signal φOUTA between times t8 and t9.

As already described, when the burst length is 4 bits, 2-bit prefetch operation is repeated twice, and in other words, the operation of simultaneously amplifying data of 2 bits by read preamplifiers A0 and A1 is repeated twice. Thereby, values of 4 bits per one data I/O terminal DQi are continuously read out.

[Structures for Pipeline Operation]

FIG. 18 is a schematic block diagram showing a structure of Y-address counter circuit 82 shown in FIG. 1.

Y-address counter circuit 82 includes 2-bit counters 820.0–820.j which are connected together in series. Two-bit counters 820.0–820.j store initially corresponding external column address signals ext.A0–ext.Aj during an active period of signal φya, respectively. During the full page mode period, two-bit counters 820.0–820.j count the toggle periods of clock signal CLK and simultaneously issue corresponding internal column address signals Y0–Yj, respectively.

Each of 2-bit counters 820.0–820.j is supplied with a signal /T which is an output signal of a NAND circuit 822 receiving signals CLK and MFL, and is also supplied with an output signal T of an inverter 824 which receives and inverts the output of NAND circuit 822.

Y-address counter circuit 82 includes an inverter 826 which receives and inverts signal φya, a delay stage 832 which receives and delays the output of inverter 826 by a predetermined time, a NAND circuit 828 which receives signal T, the output of delay stage 832 and the output of inverter 826, and outputs a signal /T1, and an inverter 830 which receives and inverts the output of NAND circuit 828 for outputting a signal T1. Signals T1 and /T1 are also supplied to 2-bit counters 820.0–820.j.

Figure 19:
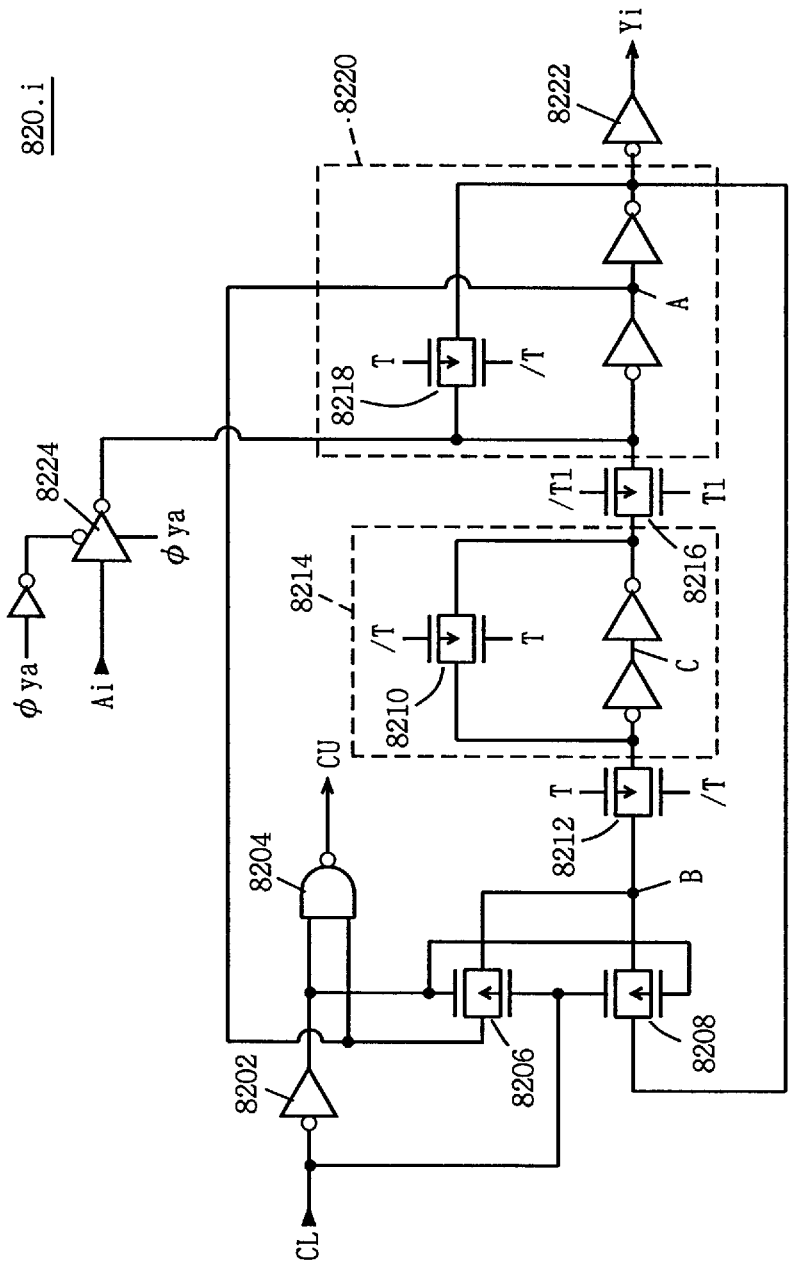
FIG. 19 is a circuit diagram showing a structure of a 2-bit counter circuit.

FIG. 19 is a circuit diagram showing a structure of 2-bit counter 820.i located at an ith position and shown in FIG. 18.

Two-bit counter 820.i includes an inverter 8202 receiving a carry signal CL from the 2-bit counter at (i−1)th position, a NAND circuit 8204 which receives on one of its inputs the output of inverter 8202 and issues a carry signal CU, a clocked inverter 8224 which receives signal Ai and is activated in response to activation of signal φya, a latch circuit 8220 which has a transmission gate 8218 receiving the output of clocked inverter 8224 and being turned on in response to the inactive state of signal T, and forms a latch when transmission gate 8218 is on, an inverter 8222 receiving the output of latch circuit 8220 and issuing column select signal Yi, a transmission gate 8208 which receives the output of latch circuit 8220 and is turned on when signal CL is at "H" level, a transmission gate 8212 which has an input node connected to an output node B of transmission gate 8208 and is turned on when signal T is inactive, a latch circuit 8214 which has a transmission gate 8210 receiving the output of transmission gate 8212 and being turned on in response to the active state of signal T, and forms a latch when transmission gate 8210 is on, a transmission gate 8216 which is connected between the output node of latch circuit 8214 and the input node of latch circuit 8220, and is turned on in response to the active state of signal T1, and a transmission gate 8206 which is connected to node B and the other input node of NAND circuit 8204, and is turned on in response to "L" level of signal CL.

The other input node of NAND circuit 8204 is connected to a connection node A between the two inverters forming latch circuit 8220. The connection node between the two inverters forming latch circuit 8214 is indicated by "C".

Figure 20:
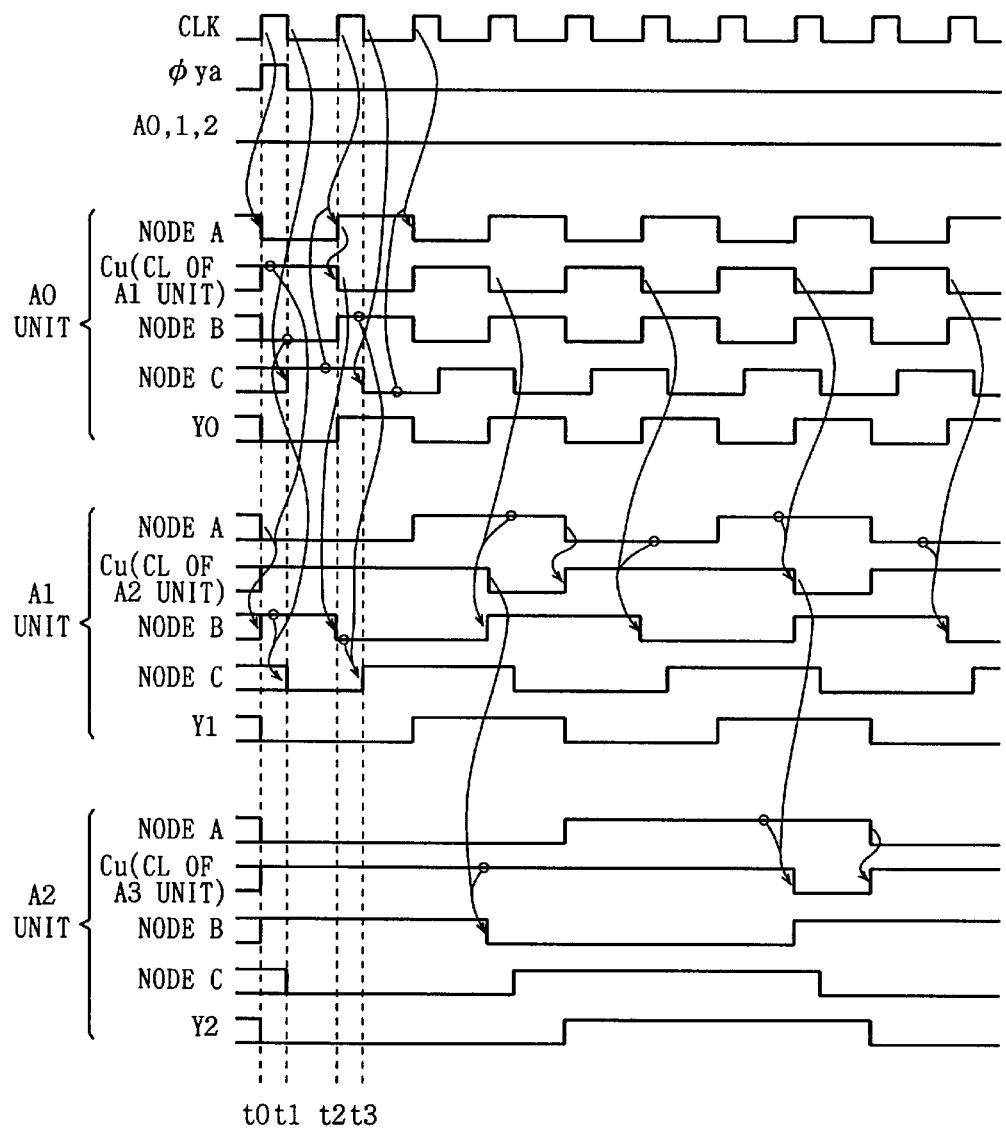
FIG. 20 is a timing chart showing an operation of a Y-address counter circuit.

FIG. 20 is a timing chart showing an operation of Y-address counter circuit 82 shown in FIGS. 18 and 19.

FIG. 20 shows an operation of only a portion in the 2-bit counters shown in FIG. 18, and more specifically shows an operation relating only to the 2-bit counters issuing internal column address signals Y0, Y1 and Y2. The 2-bit counters corresponding to bits higher than them operate basically in the same manner.

At time t0, signal φya is activated in response to activation of signal CLK. Thereby, clocked inverter 8224 is activated, and the inverted signal of corresponding column address signal Ai is held by latch circuit 8220. Thus, the level on node A changes in accordance with the value of address signal Ai. In A0 counter unit, node CL is grounded so that transmission gate 8206 is always on. At this time, therefore, the level change on node A is transmitted onto node B through transmission gate 8206. At subsequent time t1, signal T is deactivated in response to deactivation of clock signal CLK so that transmission gate 8212 is turned on. In response to this, the level on node B, i.e., the level on node A is held by latch circuit 8214. In this manner, A0 counter unit issues corresponding internal column address signal Y0 in accordance with external column address signal Ai held by latch circuit 8220.

In the A1 and A2 counter units, internal column address signals Y1 and Y2 are likewise issued in accordance with corresponding external column address signals A1 and A2, respectively.

When signal CU sent from the A0 counter attains "L" level in accordance with the level change on node A of the A0 counter, signal CL of A1 counter attains "H" level. In response to this, transmission gate 8208 in the A1 counter unit is turned on. Therefore, data held by latch circuit 8220 in the A1 counter unit is changed (i.e., the potential level on node C becomes equal to the potential level on node A) in accordance with the data held by latch circuit 8214 in the A1 counter unit.

In response to the rising edge of clock signal CLK at time t2, signal T1 is activated, and transmission gate 8216 in each counter unit is turned on. In the A0 counter unit, the level on node A is inverted in accordance with the level on node C. Thereby, the level of output signal CU of the A0 counter unit is inverted (i.e., the output signal CU of the A0 counter unit attains "L" level).

Signal CU in A0 counter unit forms signal CL in the A1 counter unit, which turns off transmission gate 8208 in the A1 counter unit, turns on transmission gate 8206, and sets the potential level on node B to be equal to the potential level on node A.

In response to deactivation of signal CLK at time t3, the level on node C in the A0 counter unit is inverted in accordance with the level on node B. Further, the level on node C in the A1 counter unit is inverted in accordance with the level on node B in the A1 counter unit.

Thereafter, the levels on nodes A and C in the A0 counter unit are inverted in accordance with activation and deactivation of signal CLK, and the level on node C in the A1 counter unit is inverted in accordance with inversion of the level on node A or C in the A0 counter unit. The same relationship as the above is exhibited between the level change on nodes A and C in the A1 counter unit and the level change on nodes A and C in the A2 counter unit.

Therefore, based on the period of toggle of signal CLK, the A0 counter unit operates to invert the level of its output signal Y0 at periods each equal to double the period of toggle, and the A1 counter unit operates to invert the level of signal Y0 at periods each equal to double the frequency of signal Y0 and invert the level of signal Y2 at periods each equal to double the frequency of signal Y1.

Figure 21:
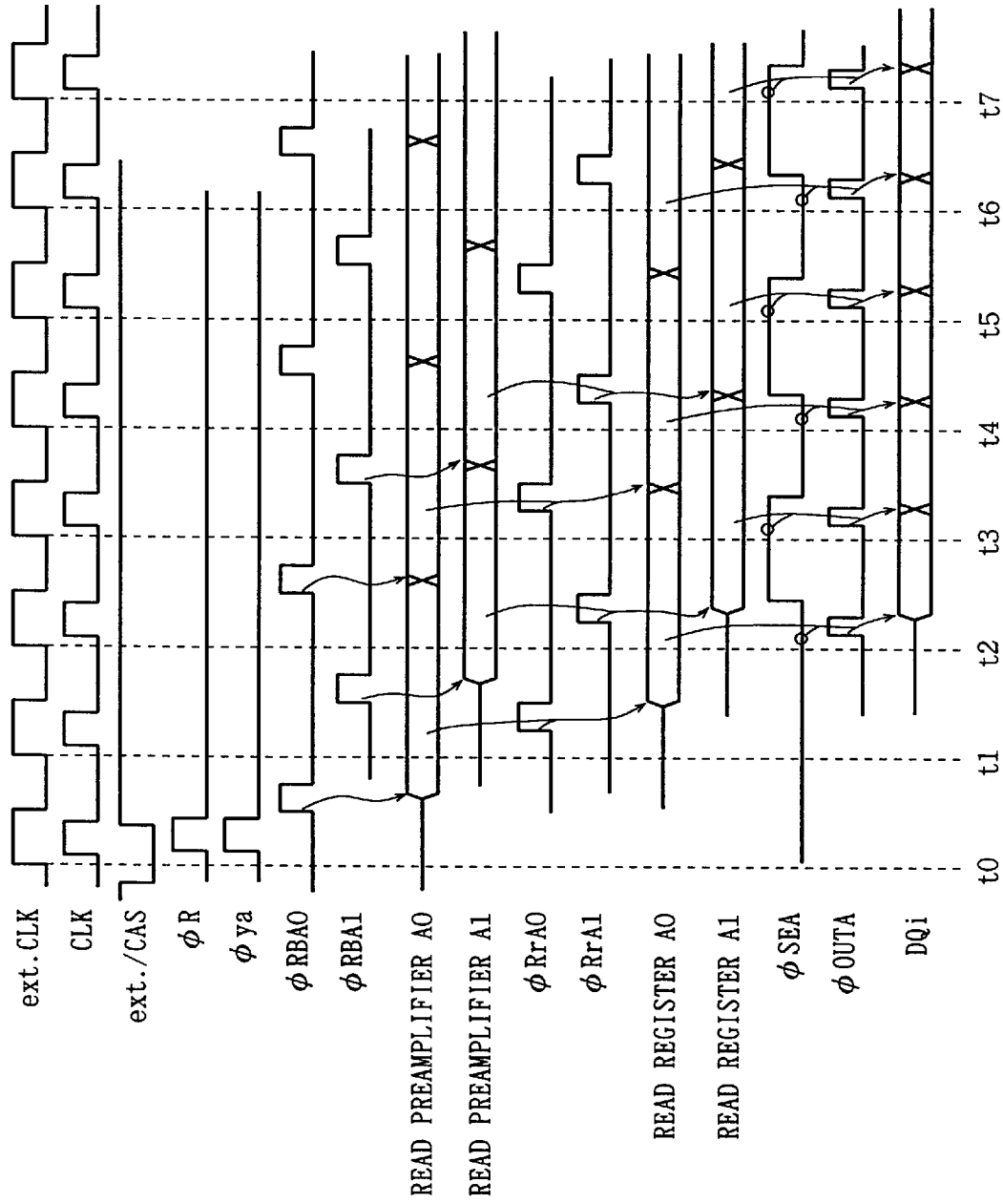
FIG. 21 is a timing chart showing a full page mode operation in the SDRAM 1000.

FIG. 21 is a timing chart showing a pipeline operation of SDRAM 1000 of the invention.

In the following description, it is assumed that the CAS latency of 3 is designated, bank A is already activated by the bank activating command, and ext.A0=0, i.e., the even-numbered address is designated as the start address of the column.

At the rising edge of external clock signal ext.CLK at time t0, external column address strobe signal ext./CAS is active (at "L" level), signal ext./RAS is at "H" level, signal ext./CS is at "L" level, and external write enable signal ext./WE (not shown) is inactive. In response the this state, the column address signal is taken in, and the read operation is designated so that first control signal generating circuit 62 issues active control signal φR.

In accordance with this, second control signal generating circuit 63 activates read preamplifier activating signal φRBA0. Read preamplifier A0 amplifies the data read from the memory cell in memory cell array bank A0 selected in accordance with the external address.

In accordance with the rising edge of external clock signal ext.CLK at time t1, second control signal generating circuit 63 activates read register activating signal φRrA0 so that read register A0 stores the read data amplified by read preamplifier A0. Second control signal generating circuit 63 issues active read preamplifier activating signal φRBA1 so that read preamplifier A1 amplifies the data read from the memory cell selected in memory cell array bank A1.

In response to the rising edge of external clock signal ext.CLK at time t2, second control signal generating circuit 63 issues output buffer activating signal φOUTA so that the output buffer issues to the corresponding data I/O terminal DQi first read data, i.e., read data amplified by read preamplifier A0 in the cycle between times t0 and t1.

Meanwhile, second control signal generating circuit 63 issues active read register activating signal φRrA1, and read register A1 stores second read data amplified by read preamplifier A1.

In the cycle between times t2 and t3, read preamplifier activating signal φRBA0 is activated again, and read preamplifier A0 amplifies data read from the memory cell column which is selected for a second time in memory cell array bank A0.

Thereafter, operations are performed similarly. More specifically, read preamplifier activating signals φRBA0 and φRBA1 are alternately activated at every cycle of the external clock signal, and data read from memory cell array banks A0 and A1 are alternately output to data I/O terminal DQi. As already described, memory cell array banks A0 and A1 correspond to the columns at the even-numbered positions and the odd-numbered positions in the memory cell array, respectively, and all the columns crossing the selected row are selected in the full page mode. Therefore, the column selection is performed alternately in memory cell array banks A0 and A1, whereby the operation in the full page mode is achieved.

As already described, SDRAM 1000 of the embodiment 1 of the invention operates in accordance with the externally supplied instruction, and more specifically operates in the 2-bit prefetch mode in such a manner that data of 2 bits are simultaneously read from memory cell array banks A0 and A1, and the data of a predetermined burst length are alternately issued to data I/O terminal DQ.

When the page mode operation is designated, data are read from all the memory cell columns crossing the selected row in such a manner that the columns in memory cell array banks A0 and A1 are alternately selected for data reading, and the data thus read are issued to data I/O terminal DQi.

In this full page mode operation, the read preamplifiers alternately operate at every cycle of the external clock signal so that operations such as precharging of the I/O line pair can be performed for one of the memory cell array banks corresponding to one of the read amplifiers while data is being read from the other memory cell array bank corresponding to the other read amplifier. In the full page mode, therefore, the speed of the data output operation in the pipeline mode can be easily increased.

When ext.A0=1 and therefore an odd-numbered address is designated as the start address of the column, the order of cycles of change in signals φRBA0 and φRBA1 as well as change in signal φSEA are opposite to those in the case where an even-numbered address is designated, similarly to the 2-bit prefetch operation.

In the 2-bit prefetch operation mode, a high speed can be maintained in the operation of reading data of a predetermined burst length, and also data reading in the full page mode can be performed at a high speed.

[Embodiment 2]

Figure 22:
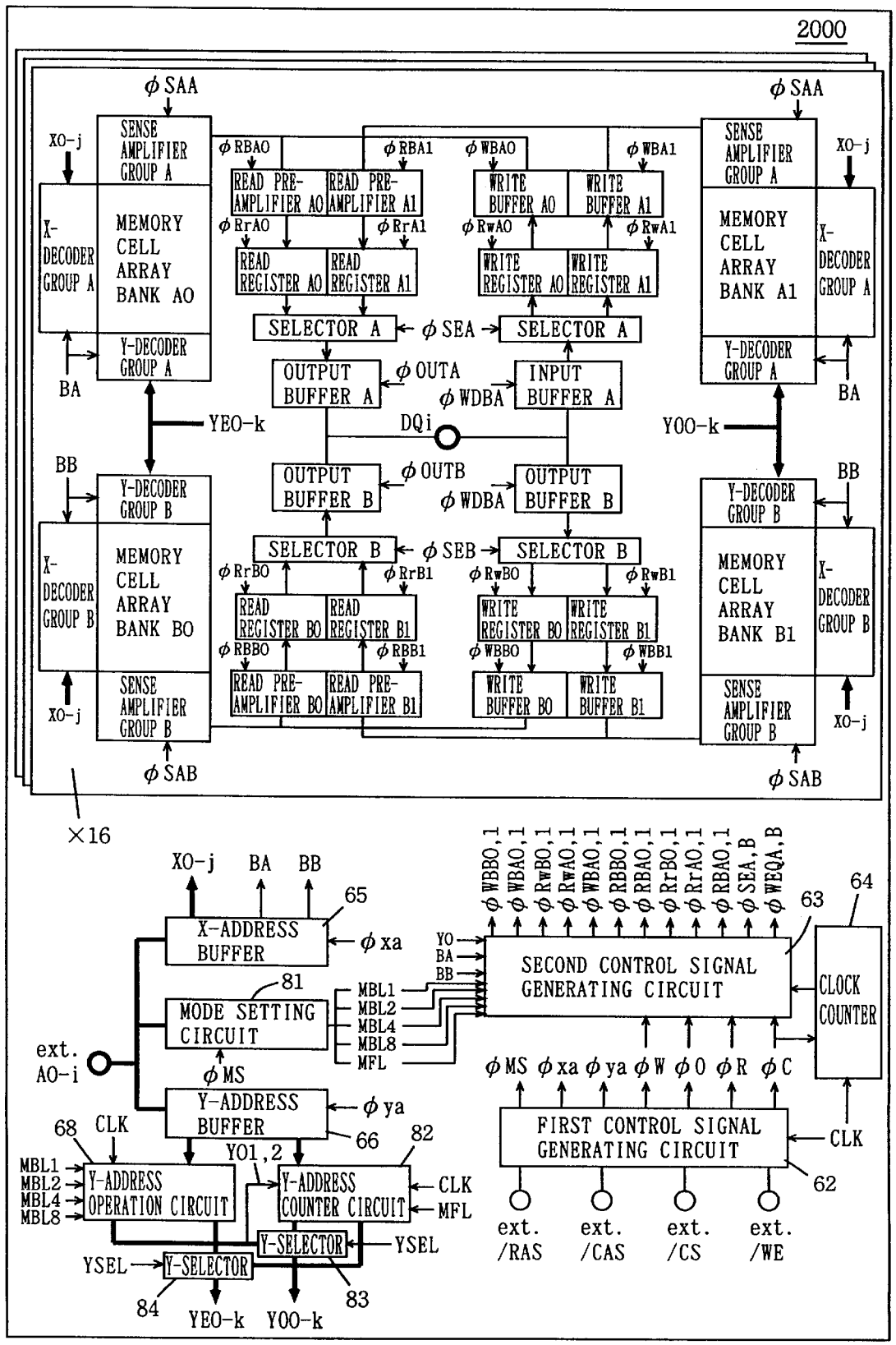
FIG. 22 functionally shows a major portion of a SDRAM 2000 of an embodiment 2 of the invention.

FIG. 22 functionally shows a structure of a major portion of a SDRAM 2000 of an embodiment 2 of the invention.

SDRAM 2000 differs from the SDRAM of the embodiment 1 shown in FIG. 1 in that odd-numbered column select signals YO1 and YO2 issued from the Y-address operation circuit are also supplied to Y-address counter circuit 82.

Structures other than the above are the same as those of SDRAM 1000 of the embodiment 1 shown in FIG. 1. The same parts and portions bear the same reference numbers, and will not be described below.

Figure 23A:
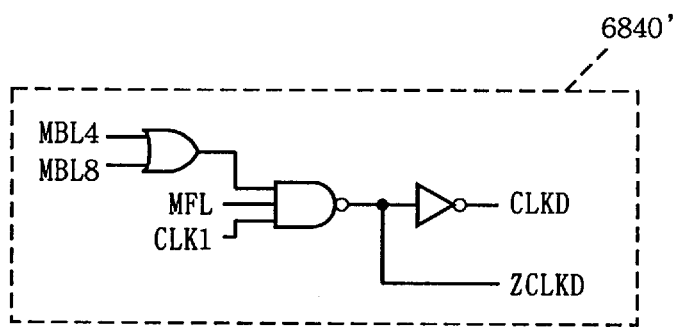
FIGS. 23A and 23B are circuit diagrams showing a structure of an internal control clock generating circuit in a Y-address operation circuit in the SDRAM 2000.
Figure 23B:
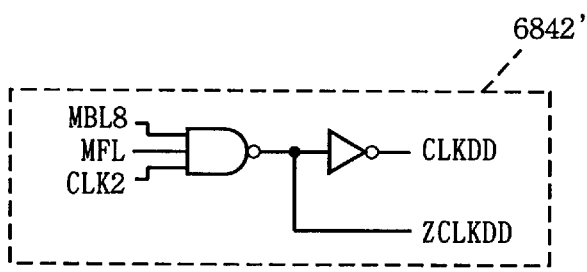

FIGS. 23A and 23B are circuit diagrams showing structures of internal control clock generating circuits 6840' and 6842' in a Y-address operation circuit shown in FIG. 22.

These circuits differ from the control clock generating circuit shown in FIG. 13 only in that signals CLKD and ZCLKD are issued in accordance with clock signal CLK1 only when control signal MFL is active, and thereby control signals CLKDD and ZCLKDD are issued.

Structures other than the above are similar to those of control clock generating circuits 6840 and 6842 shown in FIG. 13. The same parts and portions bear the same reference numbers, and will not be described below.

Figure 24:
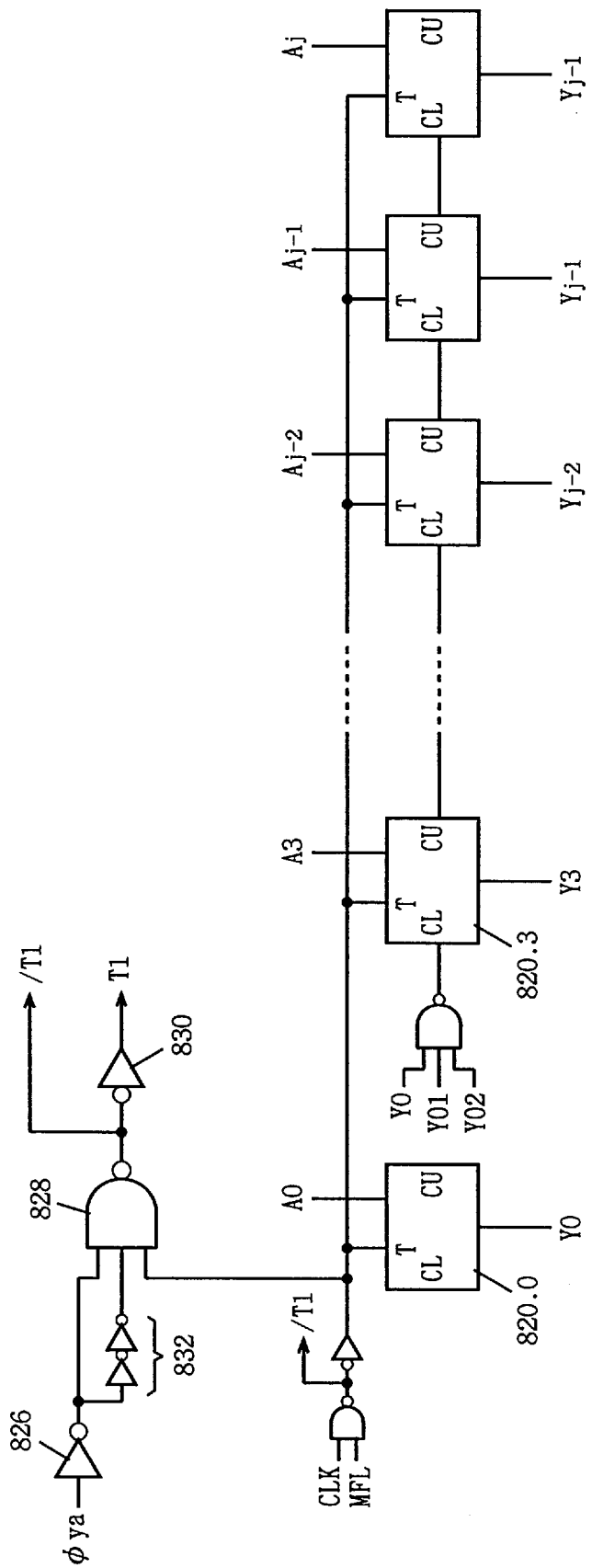
FIG. 24 is a schematic block diagram showing a structure of the Y-address counter circuit 82 in the SDRAM 2000 of the embodiment 2.
Figure 25:
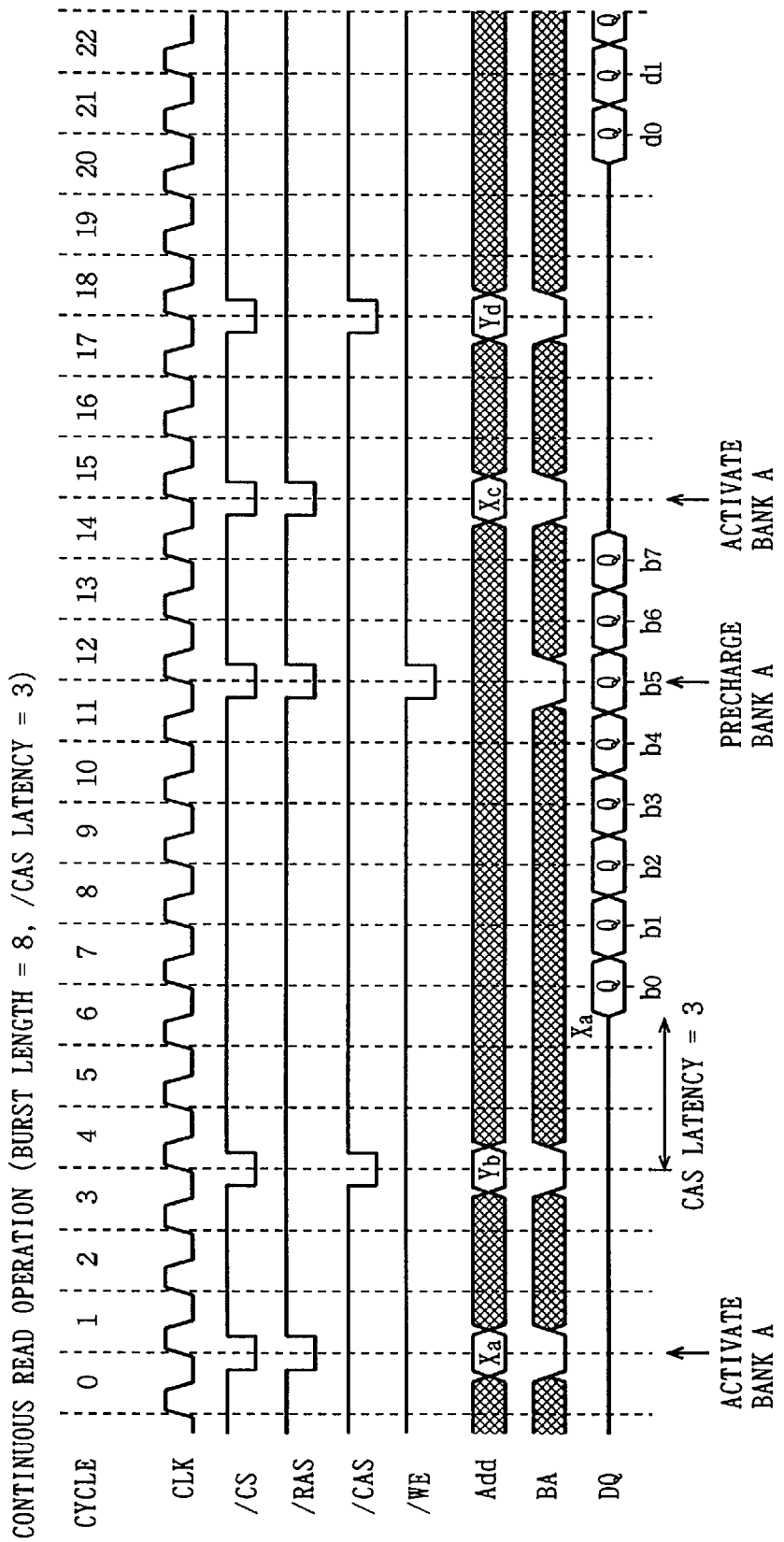
FIG. 25 is a timing chart showing a continuous read operation of a SDRAM in the prior art.
Figure 26:
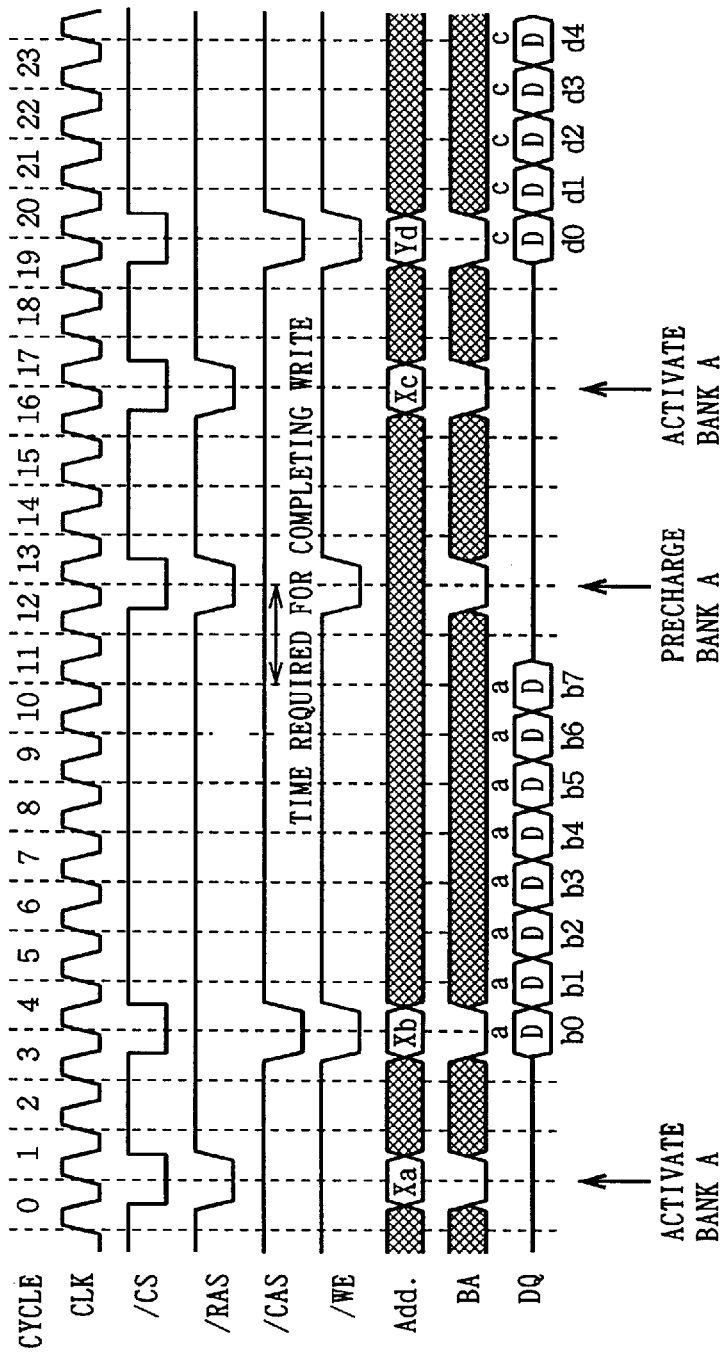
FIG. 26 is a timing chart showing a continuous write operation of the SDRAM in the prior art.

FIG. 24 is a schematic block diagram showing a structure of Y-address counter circuit 82 in the embodiment 2, and corresponds to FIG. 18 showing the embodiment 1.

Y-address counter circuit 82 in FIG. 24 differs from the Y-address counter circuit of the embodiment 1 shown in FIG. 18 in that 2-bit counters 820.1 and 820.2 are eliminated, and 2-bit counter 820.3 is connected at its input node CL to an output of a NAND circuit receiving signals Y0, YO1 and YO2 on its inputs.

As will be described below, the foregoing structure can achieve the same operation as that by the Y-address counter circuits shown in FIG. 18.

In the operation of the Y-address counter circuit in the embodiment 1, the Y-address is incremented by one in response to every issuance of signal CLK. When the Y-address is incremented from 7 to 8, a relationship of Y0=Y1=Y2=1 changes into Y0=Y1=Y2=0, signal CU of counter unit 820.2 of Y2 and signal CL of counter unit 820.3 of Y3 equal to the above signal CU attain "L" so that transmission gate 8208 of counter unit 820.3 is turned off, and transmission gate 8206 of the same is turned on. Thereby, the potential level on node C becomes equal to the inverted level of the level on node A, and the output of the Y3 counter unit changes from Y3=0 to Y3=1. When the Y-address is incremented from 15 to 16, Y0=Y1=Y2=0 changes into Y0=Y1=Y2=1 so that the Y2 counter unit issues a carry signal to the Y3 counter unit, and the output of the Y3 counter unit changes from Y3=1 to Y3=0. In the next clock cycle (in which Y-address goes to 9), signal CL of counter unit 820.3 of Y3 (i.e., signal CU of counter unit 820.2 of Y2) attains "H" so that transmission gate 8208 of counter unit 820.3 is turned on, and transmission gate 8206 is turned off. Thereby, the output level of latch circuit 8202 is supplied onto node B, and node C attains the same level as node A so that the Y3 counter unit continues to issue "1" as Y3. Thus, the Y3 counter unit is supplied with the carry signal only in the case of Y0=Y1=Y2=1.

An operation of the Y-address counter shown in FIG. 24 will now be discussed. In Y-address operation circuit 68, signals YO1 and YO2 take on the same values as externally supplied column address signals ext.A1, ext.A2. Change in signals YO1 and YO2 in the case of the burst length of 8 shown in FIG. 12 are equal to signals Y1 and Y2 issued from counter units Y1 and Y2 in FIG. 18, respectively. Therefore, the output signal sent from the NAND circuit, which receives signal Y0 issued from counter unit Y0 as well as signals YO1 and YO2, is equal to the carry signal sent from the Y2 counter unit of the Y-address counter circuit shown in FIG. 18.

Owing to the above structure, the addresses specifying the burst length other than the full page operation mode do not use the counter units in Y-address counter circuit 82 required for the full page mode, and therefore it is possible to eliminate the counter units for generating Y1 and Y2.

Accordingly, SDRAM 2000 of the embodiment 2 can achieve an effect similar to that by SDRAM 1000, and can reduce a layout area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device for receiving external signals including (a) a control signal, (b) an address signal and (c) a data signal or outputting a data signal in synchronization with an external clock signal, comprising:

a memory cell array including a plurality of memory cells arranged in rows and columns, said memory cell array including first and second memory cell array banks;

row select means for selecting corresponding rows in said first and second memory cell array banks in response to an externally supplied address signal;

internal address generating means for issuing an internal address signal corresponding to a designated operation mode in response to the externally supplied address signal;

column select means for selecting, in a first operation mode, simultaneously a first predetermined number of columns of said first and second memory cell array banks to be selected in response to said internal address, and selecting, in a second operation mode, successively a second predetermined number of columns larger in number than said first predetermined number and crossing the selected row; and data read means for operating, in said first operation mode, to amplify simultaneously the data read from said first and second memory cell array banks selected by said column select means and apply alternately the data read from said first and second memory cell array banks to a data output terminal in response to said external clock signal, and operating, in said second operation mode, to amplify alternately the data read from said first and second memory cell array banks selected by said column select means and apply alternately the read data to the data output terminal in response to said external clock signal.

2. The synchronous semiconductor memory device according to claim 1, wherein said second predetermined number is equal to the number of all the columns crossing the selected row.

3. The synchronous semiconductor memory device according to claim 2, further comprising:

first and second data lines for transmitting data to and from the memory cells selected in said first and second memory cell array banks independently of each other, respectively, wherein said column select means operates, in the first operation mode, simultaneously for said first and second memory cell array banks to connect successively the first predetermined number of columns to be selected to said first and second data lines in response to said internal address, respectively, and operating, in the second operation mode, to select successively a second predetermined number of columns larger in number than said first predetermined number and crossing the selected row to said first and second data lines in response to said internal address, respectively, and said data read means operates, in said first operation mode, to amplify simultaneously the data on said first and second data lines and apply alternately the read date to the data output terminal in response to said external clock signal, and, in said second operation mode, to amplify alternately the data on said first and second data lines and apply alternately the read data to the data output terminal in response to said external clock signal.

4. The synchronous semiconductor memory device according to claim 3, wherein said data read means includes:

first and second read amplifier means for simultaneously amplifying the data on said first and second data lines in said first operation mode, and alternately amplifying the data on said first and second data lines in said second operation mode, and first and second latch means for receiving and holding the outputs of said first and second read amplifier means, and alternately applying the read data to the data output terminal in response to said external clock signal in the data read operation.

5. The synchronous semiconductor memory device according to claim 2, wherein said first memory cell array bank includes the columns at even-numbered positions in said memory cell array, said second memory cell array bank includes the columns at odd-numbered positions in said memory cell array, and said column select means simultaneously selects the column belonging to said first memory cell array bank and the column belonging to said second memory cell array bank neighboring to each other in said first operation mode.

6. The synchronous semiconductor memory device according to claim 2, further comprising:

operation mode detecting means for detecting which of said first and second operation modes is selected in accordance with externally supplied said control signals and said address signal;

said external signals include:

a chip enable signal, an external row address strobe signal, an external column address strobe signal, and an external write enable signal; and said operation mode detecting means detects the designated operation mode in accordance with data of a predetermined number of bits of said address signal when all of said chip select signal, said external row address strobe signal, said column address strobe signal and said write enable signal are active at an edge of activation of said external clock signal.

7. The synchronous semiconductor memory device according to claim 5, wherein said internal address generating means includes:

internal address operation means for issuing internal address signal corresponding to said first predetermined number of columns in said first operation mode, and count means for successively issuing the internal address signal corresponding to all the columns crossing said selected row in said second operation mode.

8. The synchronous semiconductor memory device according to claim 7, wherein said count means includes:

counter units mutually connected in series for generating the address signal allowing selection of all the columns crossing said selected row, wherein each of said counter units uses the externally supplied column address data as its initial value, and said count means counts the number of toggle of said external clock signal to issue an internal column address signal.

9. The synchronous semiconductor memory device according to claim 7, wherein said internal address operation means issues lower bit data of an internal column address signal corresponding to a first bit number allowing representation of the number of said first predetermined number of columns while using an externally supplied column address as an initial value and changing said lower bit data to select the memory cells in said first and second memory cell array banks, said count means includes a plurality of counter units mutually connected in series and corresponding in number to the number smaller by said first bit number than the bit number of the addresses of all the columns crossing said selected row, each of said counter units uses the bit data corresponding to the externally supplied column address as its initial value, and said count means starts a count operation in accordance with an output of said internal address operation means, successively counts the number of toggle of said external clock signal, and issues a higher bit data larger than the lowest bit by said first bit number.

* * * * *